(12) United States Patent
Lee et al.

(10) Patent No.: US 8,501,507 B2
(45) Date of Patent: Aug. 6, 2013

(54) METHOD FOR LARGE SCALE MANUFACTURE OF THIN FILM PHOTOVOLTAIC DEVICES USING MULTI-CHAMBER CONFIGURATION

(75) Inventors: Howard W. H. Lee, Saratoga, CA (US); Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 13/357,445

(22) Filed: Jan. 24, 2012

(65) Prior Publication Data
US 2012/0186975 A1    Jul. 26, 2012

Related U.S. Application Data

(60) Continuation of application No. 13/179,719, filed on Jul. 11, 2011, now Pat. No. 8,105,437, which is a division of application No. 12/269,768, filed on Nov. 12, 2008, now Pat. No. 7,998,762.

(60) Provisional application No. 60/988,089, filed on Nov. 14, 2007, provisional application No. 60/988,099, filed on Nov. 14, 2007.

(51) Int. Cl.
*H01L 21/00* (2006.01)

(52) U.S. Cl.
USPC ............ 438/22; 438/29; 438/46; 438/47; 313/506; 428/690

(58) Field of Classification Search
USPC .......... 438/22, 29, 34, 46, 47, 57, 73, 74, 438/95; 257/40, E33.001, E25.008, E51.018; 313/504, 506; 428/690, 917
See application file for complete search history.

(56) References Cited

U.S. PATENT DOCUMENTS

| 3,520,732 A | 7/1970 | Nakayama et al. |
| 3,975,211 A | 8/1976 | Shirland |

(Continued)

FOREIGN PATENT DOCUMENTS

| AU | 1998/7865198 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Hsien Ming Lee
(74) *Attorney, Agent, or Firm* — Kilpatrick Townsend & Stockton LLP

(57) ABSTRACT

A method for large scale manufacture of photovoltaic devices includes loading a substrate into a load lock station and transferring the substrate in a controlled ambient to a first process station. The method includes formation of a first conductor layer overlying the surface region of the substrate. The method includes transferring the substrate to a second process station, and forming a second layer overlying the surface region of the substrate. The method further includes repeating the transferring and processing until all thin film materials of the photovoltaic devices are formed. In an embodiment, the invention also provides a method for large scale manufacture of photovoltaic devices including feed forward control. That is, the method includes in-situ monitoring of the physical, electrical, and optical properties of the thin films. These properties are used to determine and adjust process conditions for subsequent processes.

8 Claims, 17 Drawing Sheets

U.S. PATENT DOCUMENTS

| | | | |
|---|---|---|---|
| 4,062,038 A | 12/1977 | Cuomo et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,518,855 A | 5/1985 | Malak | |
| 4,532,372 A | 7/1985 | Nath et al. | |
| 4,542,255 A | 9/1985 | Tanner et al. | |
| 4,581,108 A | 4/1986 | Kapur et al. | |
| 4,589,194 A | 5/1986 | Roy | |
| 4,598,306 A | 7/1986 | Nath et al. | |
| 4,599,154 A | 7/1986 | Bender et al. | |
| 4,611,091 A | 9/1986 | Choudary et al. | |
| 4,623,601 A | 11/1986 | Lewis et al. | |
| 4,625,070 A | 11/1986 | Berman et al. | |
| 4,638,111 A | 1/1987 | Gay | |
| 4,661,370 A | 4/1987 | Tarrant | |
| 4,663,495 A | 5/1987 | Berman et al. | |
| 4,705,912 A | 11/1987 | Nakashima et al. | |
| 4,724,011 A | 2/1988 | Turner et al. | |
| 4,727,047 A | 2/1988 | Bozler et al. | |
| 4,751,149 A | 6/1988 | Vijayakumar et al. | |
| 4,775,425 A | 10/1988 | Guha et al. | |
| 4,793,283 A | 12/1988 | Sarkozy | |
| 4,798,660 A | 1/1989 | Ermer et al. | |
| 4,816,082 A | 3/1989 | Guha et al. | |
| 4,816,420 A | 3/1989 | Bozler et al. | |
| 4,837,182 A | 6/1989 | Bozler et al. | |
| 4,865,999 A | 9/1989 | Xi et al. | |
| 4,873,118 A | 10/1989 | Elias et al. | |
| 4,915,745 A | 4/1990 | Pollock et al. | |
| 4,950,615 A | 8/1990 | Basol et al. | |
| 4,968,354 A | 11/1990 | Nishiura et al. | |
| 4,996,108 A | 2/1991 | Divigalpitiya et al. | |
| 5,008,062 A | 4/1991 | Anderson et al. | |
| 5,011,565 A | 4/1991 | Dube et al. | |
| 5,028,274 A | 7/1991 | Basol et al. | |
| 5,039,353 A | 8/1991 | Schmitt | |
| 5,045,409 A | 9/1991 | Eberspacher et al. | |
| 5,069,727 A | 12/1991 | Kouzuma et al. | |
| 5,078,803 A | 1/1992 | Pier et al. | |
| 5,125,984 A | 6/1992 | Kruehler et al. | |
| 5,133,809 A | 7/1992 | Sichanugrist et al. | |
| 5,137,835 A | 8/1992 | Karg | |
| 5,154,777 A | 10/1992 | Blackmom et al. | |
| 5,180,686 A | 1/1993 | Banerjee et al. | |
| 5,211,824 A | 5/1993 | Knapp | |
| 5,217,564 A | 6/1993 | Bozler et al. | |
| 5,231,047 A | 7/1993 | Ovshinsky et al. | |
| 5,248,345 A | 9/1993 | Sichanugrist et al. | |
| 5,259,883 A | 11/1993 | Yamabe et al. | |
| 5,261,968 A | 11/1993 | Jordan | |
| 5,298,086 A | 3/1994 | Guha et al. | |
| 5,336,623 A | 8/1994 | Sichanugrist et al. | |
| 5,346,853 A | 9/1994 | Guha et al. | |
| 5,397,401 A | 3/1995 | Toma et al. | |
| 5,399,504 A | 3/1995 | Ohsawa | |
| 5,436,204 A | 7/1995 | Albin et al. | |
| 5,445,847 A | 8/1995 | Wada | |
| 5,474,939 A | 12/1995 | Pollock et al. | |
| 5,501,744 A | 3/1996 | Albright et al. | |
| 5,512,107 A | 4/1996 | Van den Berg | |
| 5,528,397 A | 6/1996 | Zavracky et al. | |
| 5,536,333 A | 7/1996 | Foote et al. | |
| 5,578,103 A | 11/1996 | Araujo et al. | |
| 5,578,503 A | 11/1996 | Karg et al. | |
| 5,622,634 A | 4/1997 | Noma et al. | |
| 5,626,688 A | 5/1997 | Probst et al. | |
| 5,665,175 A | 9/1997 | Safir | |
| 5,676,766 A | 10/1997 | Probst et al. | |
| 5,726,065 A | 3/1998 | Szlufcik et al. | |
| 5,738,731 A | 4/1998 | Shindo et al. | |
| 5,858,819 A | 1/1999 | Miyasaka | |
| 5,868,869 A | 2/1999 | Albright et al. | |
| 5,977,476 A | 11/1999 | Guha et al. | |
| 5,981,868 A | 11/1999 | Kushiya et al. | |
| 5,985,691 A | 11/1999 | Basol et al. | |
| 6,040,521 A | 3/2000 | Kushiya et al. | |
| 6,048,442 A | 4/2000 | Kushiya et al. | |
| 6,092,669 A | 7/2000 | Kushiya et al. | |
| 6,107,562 A | 8/2000 | Hashimoto et al. | |
| 6,127,202 A | 10/2000 | Kapur et al. | |
| 6,160,215 A | 12/2000 | Curtin | |
| 6,166,319 A | 12/2000 | Matsuyama | |
| 6,172,297 B1 | 1/2001 | Hezel et al. | |
| 6,258,620 B1 | 7/2001 | Morel et al. | |
| 6,294,274 B1 | 9/2001 | Kawazoe et al. | |
| 6,307,148 B1 | 10/2001 | Takeuchi et al. | |
| 6,323,417 B1 | 11/2001 | Gillespie et al. | |
| 6,328,871 B1 | 12/2001 | Ding et al. | |
| RE37,512 E | 1/2002 | Szlufcik et al. | |
| 6,361,718 B1 | 3/2002 | Shinmo et al. | |
| 6,372,538 B1 | 4/2002 | Wendt et al. | |
| 6,423,565 B1 | 7/2002 | Barth et al. | |
| 6,632,113 B1 | 10/2003 | Noma et al. | |
| 6,635,307 B2 | 10/2003 | Huang et al. | |
| 6,653,701 B1 | 11/2003 | Yamazaki et al. | |
| 6,667,492 B1 | 12/2003 | Kendall | |
| 6,690,041 B2 | 2/2004 | Armstrong et al. | |
| 6,692,820 B2 | 2/2004 | Forrest et al. | |
| 6,784,492 B1 | 8/2004 | Morishita | |
| 6,852,920 B2 | 2/2005 | Sager et al. | |
| 6,878,871 B2 | 4/2005 | Scher et al. | |
| 6,974,976 B2 | 12/2005 | Hollars | |
| 7,122,398 B1 | 10/2006 | Pichler | |
| 7,179,677 B2 | 2/2007 | Ramanathan et al. | |
| 7,194,197 B1 | 3/2007 | Wendt et al. | |
| 7,220,321 B2 | 5/2007 | Barth et al. | |
| 7,235,736 B1 | 6/2007 | Buller et al. | |
| 7,252,923 B2 | 8/2007 | Kobayashi | |
| 7,265,037 B2 | 9/2007 | Yang et al. | |
| 7,319,190 B2 | 1/2008 | Tuttle | |
| 7,364,808 B2 | 4/2008 | Sato et al. | |
| 7,442,413 B2 | 10/2008 | Zwaap et al. | |
| 7,544,884 B2 | 6/2009 | Hollars | |
| 7,642,372 B2 * | 1/2010 | Smith | 560/232 |
| 7,736,755 B2 | 6/2010 | Igarashi et al. | |
| 7,741,560 B2 | 6/2010 | Yonezawa | |
| 7,855,089 B2 | 12/2010 | Farris, III et al. | |
| 7,863,074 B2 | 1/2011 | Wieting | |
| 7,910,399 B1 | 3/2011 | Wieting | |
| 7,955,891 B2 | 6/2011 | Wieting | |
| 7,960,204 B2 | 6/2011 | Lee | |
| 7,993,954 B2 | 8/2011 | Wieting | |
| 7,993,955 B2 | 8/2011 | Wieting | |
| 7,998,762 B1 | 8/2011 | Lee et al. | |
| 8,003,430 B1 | 8/2011 | Lee | |
| 8,008,110 B1 | 8/2011 | Lee | |
| 8,008,111 B1 | 8/2011 | Lee | |
| 8,008,112 B1 | 8/2011 | Lee | |
| 8,017,860 B2 | 9/2011 | Lee | |
| 8,142,521 B2 | 3/2012 | Wieting | |
| 8,168,463 B2 | 5/2012 | Wieting | |
| 8,178,370 B2 | 5/2012 | Lee et al. | |
| 8,183,066 B2 | 5/2012 | Lee et al. | |
| 8,217,261 B2 | 7/2012 | Wieting | |
| 2002/0002992 A1 | 1/2002 | Kariya et al. | |
| 2002/0004302 A1 | 1/2002 | Fukumoto et al. | |
| 2002/0061361 A1 | 5/2002 | Nakahara et al. | |
| 2002/0063065 A1 | 5/2002 | Sonoda et al. | |
| 2003/0075717 A1 | 4/2003 | Kondo et al. | |
| 2003/0089899 A1 | 5/2003 | Lieber et al. | |
| 2003/0188777 A1 | 10/2003 | Gaudiana et al. | |
| 2003/0230338 A1 | 12/2003 | Menezes | |
| 2004/0063320 A1 | 4/2004 | Hollars | |
| 2004/0084080 A1 | 5/2004 | Sager et al. | |
| 2004/0095658 A1 | 5/2004 | Buretea et al. | |
| 2004/0110393 A1 | 6/2004 | Munzer et al. | |
| 2004/0187917 A1 | 9/2004 | Pichler | |
| 2004/0245912 A1 | 12/2004 | Thurk et al. | |

| | | |
|---|---|---|
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0209700 A1 | 9/2007 | Yonezawa et al. |
| 2008/0029154 A1 | 2/2008 | Mishtein et al. |
| 2008/0041446 A1 | 2/2008 | Wu et al. |
| 2008/0092945 A1 | 4/2008 | Munteanu et al. |
| 2008/0092953 A1 | 4/2008 | Lee |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki' |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}GaxSe_2$ Solar Cells on Rigid and Flexible Substrates using Nanoparticle Precursor Inks", Thin Solid films, 2003, vol. 431-432, pp. 53-57.

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Metha et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of CuInS2 Thin Films Solar Cells with Large Grain, Elsevier Science B.V; Solar Energy Materials & Solar Cells 69 (2001) pp. 261-269.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

Salvador, "Hole diffusion length in $n$-TiO$_2$ single crystals and sintered electrodes: photoelectrochemical determination and comparative analysis," Journal of Applied Physics, vol. 55, No. 8, pp. 2977-2985, Apr. 15, 1984.

* cited by examiner

METHOD FOR LARGE SCALE MANUFACTURE OF THIN FILM PHOTOVOLTAIC DEVICES USING MULTI-CHAMBER CONFIGURATION

CROSS-REFERENCES TO RELATED APPLICATIONS

This application is a continuation of U.S. patent application Ser. No. 13/179,719 filed on Jul. 11, 2011, which is a division of U.S. patent application Ser. No. 12/269,768 filed on Nov. 12, 2008, which claims priority to (a) U.S. Provisional Application No. 60/988,089 filed Nov. 14, 2007 and (b) U.S. Provisional Patent Application No. 60/988,099, filed Nov. 14, 2007, the contents of all the above applications are incorporated by reference herein in their entirety for all purposes.

This application is also related to (a) U.S. patent application Ser. No. 11/748,444, filed May 14, 2007, (b) U.S. patent application Ser. No. 11/804,019, filed May 15, 2007, and (c) U.S. patent application Ser. No. 13/179,722, filed Jul. 11, 2011, all of which are commonly assigned and incorporated by reference herein in their entirety for all purposes.

BACKGROUND

The present invention relates generally to photovoltaic materials. More particularly, the present invention provides a method and system for large scale manufacture of multi junction and single junction solar modules using integrated manufacturing systems for thin and thick film photovoltaic materials. Merely by way of example, the present method and structure have been implemented using a solar module having multiple thin film materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form heterojunction cells using a stacked configuration. Although somewhat successful, it is often difficult to match currents between upper and lower solar cells. These and other limitations of these conventional technologies can be found throughout the present specification and more particularly below.

From the above, it is seen that improved techniques for manufacturing photovoltaic materials and resulting devices are desired.

SUMMARY

The present invention relates generally to photovoltaic materials. More particularly, the present invention provides a method and system for large scale manufacture of multi junction and single junction solar module using integrated manufacturing system and method for thin and thick film photovoltaic materials. Merely by way of example, the present method and structure have been implemented using a solar module having multiple thin film materials, but it would be recognized that the invention may have other configurations.

According to a specific embodiment, the invention provides system for manufacturing a photovoltaic device. The system includes a first load lock station and a second load lock station. The system also includes a plurality of process stations arranged in a serial configuration between the first and the second load lock stations. The plurality of process stations numbered from 1 through N, where N is an integer greater than 2. In a specific embodiment, the system includes a transfer station coupled between two adjacent process stations.

According to another embodiment, the invention provides a system for manufacturing a photovoltaic device. The system includes a load lock station and a plurality of process station. Each of the plurality of process stations being coupled to the load lock station. In a specific embodiment, the system also includes a transport station coupled between a first process station and the load lock station.

According to other embodiments of the invention, various methods are provided for large scale manufacture of photovoltaic devices. In a specific embodiment, the method includes loading a substrate into a load lock station and transferring the substrate in a controlled ambient to a first process station. The method includes using a first physical deposition process in the first process station to cause formation of a first conductor layer overlying the surface region of the substrate. The method includes transferring the substrate to a second process station, and using a second physical deposition process in the second process station to cause formation of a second layer overlying the surface region of the substrate. The method further includes repeating the transferring and processing until all thin film materials of the photovoltaic devices are formed.

In another embodiment, the invention also provides a method for large scale manufacture of photovoltaic modules including feed forward control. That is, the method includes in-situ monitoring of the physical, electrical, and optical properties of the thin films. These properties are used to determine or adjust process conditions for subsequent processes.

In an alternative embodiment, the present invention provides a system for large scale manufacture of thin film photovoltaic modules. The system includes a plurality of chambers configured to hold a substrate subjecting one or more thin film processes for manufacture of a thin film photovoltaic module. The substrate is optically transparent and has a lateral dimension of 1.5 meter and greater. The system further includes one or more load locks coupling to the plurality of chambers for loading the substrate into/out of each chamber. Additionally, the system includes a transfer tool configured to transfer the substrate into/out of each of the plurality of chambers via at least one of the one or more load locks. Embodiments of the invention provide that at least some of the plurality of chambers are configured to form a copper-indium composite material with Cu-rich stoichemistry in terms of a Cu:In ratio greater than 1.2 overlying an electrode layer on the substrate and at least one of the plurality of chambers is configured to subject the copper-indium composite material to a thermal process in a sulfur-bearing environment to form a chalcogenide structure photovoltaic film.

In yet another embodiment, the present invention provides a method for manufacture of thin film photovoltaic modules in a system with multi-chamber configuration. The method includes providing a substrate into a first chamber of the system with multi-chamber configuration. The substrate is optically transparent and has a lateral dimension of 1.5 meter and greater. Additionally, the method includes forming an electrode layer overlying the substrate in the first chamber and transferring the substrate out of the first chamber for patterning the electrode layer. The method further includes transferring the substrate with the patterned electrode layer in a second chamber of the system with multi-chamber configuration to form a copper (Cu)-bearing material layer overlying the electrode layer. Furthermore, the method includes transferring the substrate to a third chamber of the system with multi-chamber configuration to form an indium (In) layer overlying the copper-bearing material layer, which correspondingly leads to a formation of a Cu—In composite film with Cu-rich stoichiometry in terms of a Cu:In atomic ratio of 1.2:1 and greater. Moreover, the method includes subjecting the Cu—In composite film to a thermal treatment process in a fourth chamber of the system with multi-chamber configuration. The fourth chamber comprises an environment including sulfur-bearing species where the Cu—In composite film is transformed into a copper-indium-disulfide material. The method also includes forming a photovoltaic absorber layer for a thin film photovoltaic module using the copper-indium-disulfide material.

Various additional objects, features and advantages of the present invention can be more fully appreciated with reference to the detailed description and accompanying drawings that follow.

DETAILED DESCRIPTION

The present invention relates generally to photovoltaic materials. More particularly, the present invention provides a method and system for large scale manufacture of multi junction and single junction solar modules using integrated manufacturing systems for thin and thick film photovoltaic materials. Merely by way of example, the present method and structure have been implemented using a solar module having multiple thin film materials, but it would be recognized that the invention may have other configurations.

Figure 1A:
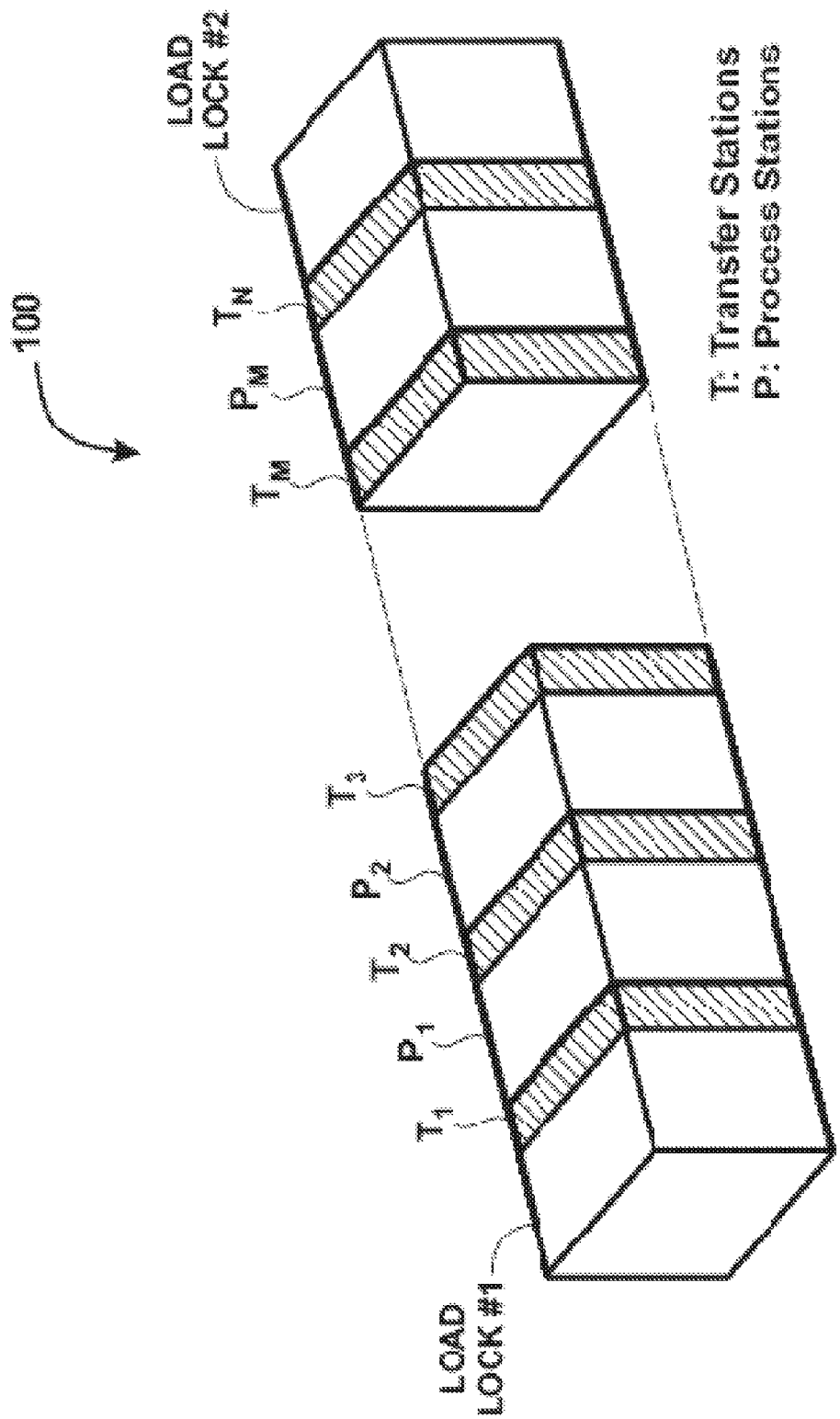
FIG. 1A is a simplified view diagram of a system for large scale manufacture of thin film photovoltaic devices according to an embodiment of the present invention.

FIG. 1A is a simplified view diagram of a system 100 for large scale manufacture of thin film photovoltaic devices according to an embodiment of the present invention. This diagram is merely an example, which should not unduly limit the scope of the claims herein. One of ordinary skill in the art would recognize other variations, modifications, and alternatives. As shown, system 100 includes load locks #1 and #2 for providing an interface between system 100 and the environment. System 100 also includes process stations P1, P2, . . . , Pm, and transport stations T1, T2, T3, . . . , Tn. Each process station is configured to perform a process required to form the thin film photovoltaic device. Depending on the embodiment, the processes can include thin film formation, patterning, etching, annealing, etc. The process stations are capable of supplying process gases, maintaining process temperature, maintaining process pressure, etc.

In a specific embodiment, a substrate, e.g. a glass substrate, is entered into system 100 through lord lock #1, which can be pumped down to a reduced pressure. Transport stations T1-Tn are configured to allow the substrate to be transported between a load lock and a process station, or between two process stations. The transport stations can provide a controlled ambient to maintain cleanliness of the substrate. For example, a transport station can allow a substrate to be transferred in a vacuum. In another example, a transport station may provide an inert gas ambient of, e.g. nitrogen or argon, and can be maintained at atmospheric pressure or at a reduced pressure.

Figure 1B:
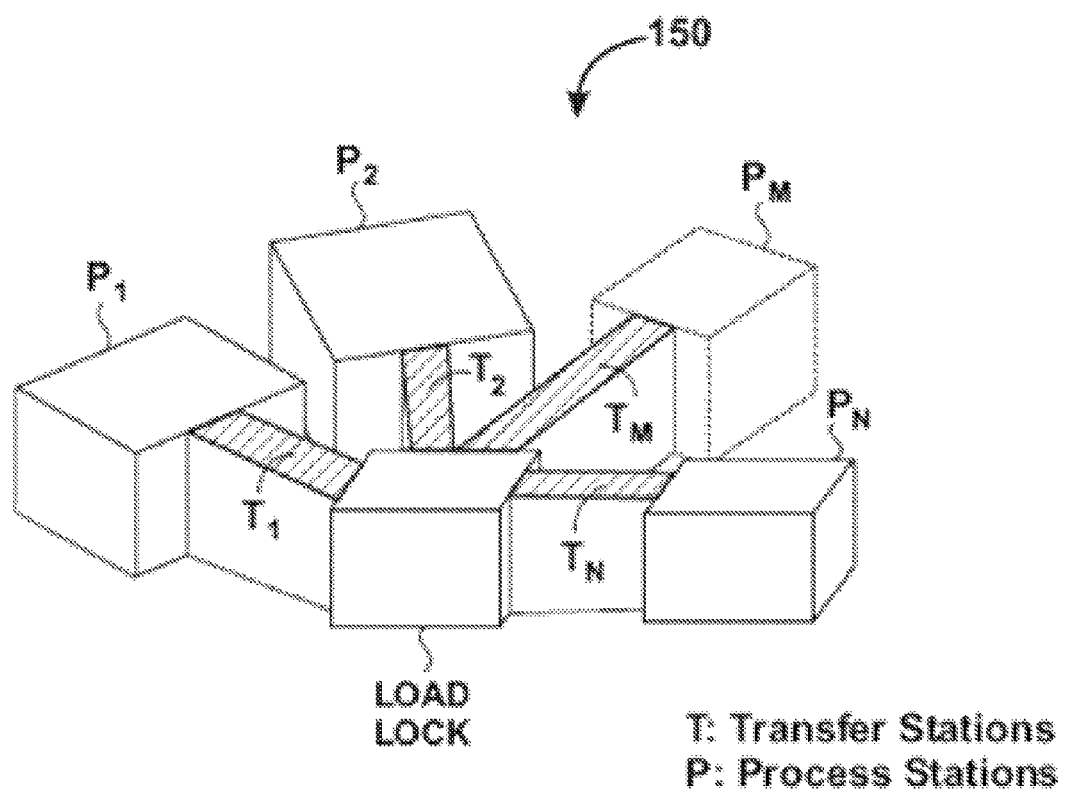
FIG. 1B is a simplified view diagram of a system for large scale manufacture of thin film photovoltaic devices according to an alternative embodiment of the present invention.

FIG. 1B is a simplified view diagram of a system 150 for large scale manufacture of thin film photovoltaic devices according to an alternative embodiment of the present invention.

This diagram is merely an example, which should not unduly limit the scope of the claims herein. One of ordinary skill in the art would recognize other variations, modifications, and alternatives. As shown, system 150 includes a load lock, multiple process stations, and multiple transport stations. The functions of the load lock, process stations, and transport stations are similar to those discussed above in connection with system 100 in FIG. 1. System 150, however, has a different configuration. A central load lock is connected to transport stations T1, T2, . . . , Tn, which in turn are coupled to process stations P1, P2, . . . , Pn. In a specific embodiment, after each process steps, the substrate is returned to the central load lock, and the next process station is selected for the next process. Of course, one of ordinary skilled in the art can recognize other configurations, variations, modifications.

System 100 and system 150 are examples of systems for large scale manufacture of thin film photovoltaic devices according to embodiments of the present invention. Depending on the embodiment, the system is configured to allow formation of junction between the window layer and the absorber layer without breaking vacuum and to keep moisture, particles, and oxygen from contaminating the substrate and the device during process. In a specific example, load locks and transport stations are provided. Inert gases can also be used at reduced or atmospheric pressure.

In a specific embodiment, a process sequence in system 100 for large scale manufacture of photovoltaic devices can be briefly summarized below.
1. Load substrate into the load-lock;
2. Pump down the load lock, turn on the heater, and flow inert gas (Ar or $N_2$) until substrate reaches set temperature;
3. Transfer substrate into the selected process station chamber;
4. Flow process gas, turn on sputtering power, and start the sputtering process;
5. Once process is finished, select the next station (process or transfer station), transfer the substrate;
6. Perform the next process in the next process station; and
7. After the process is completed, the substrate is transferred to the second load-lock.

The second load lock is vented, and the substrate is removed from the system.

Figure 2:
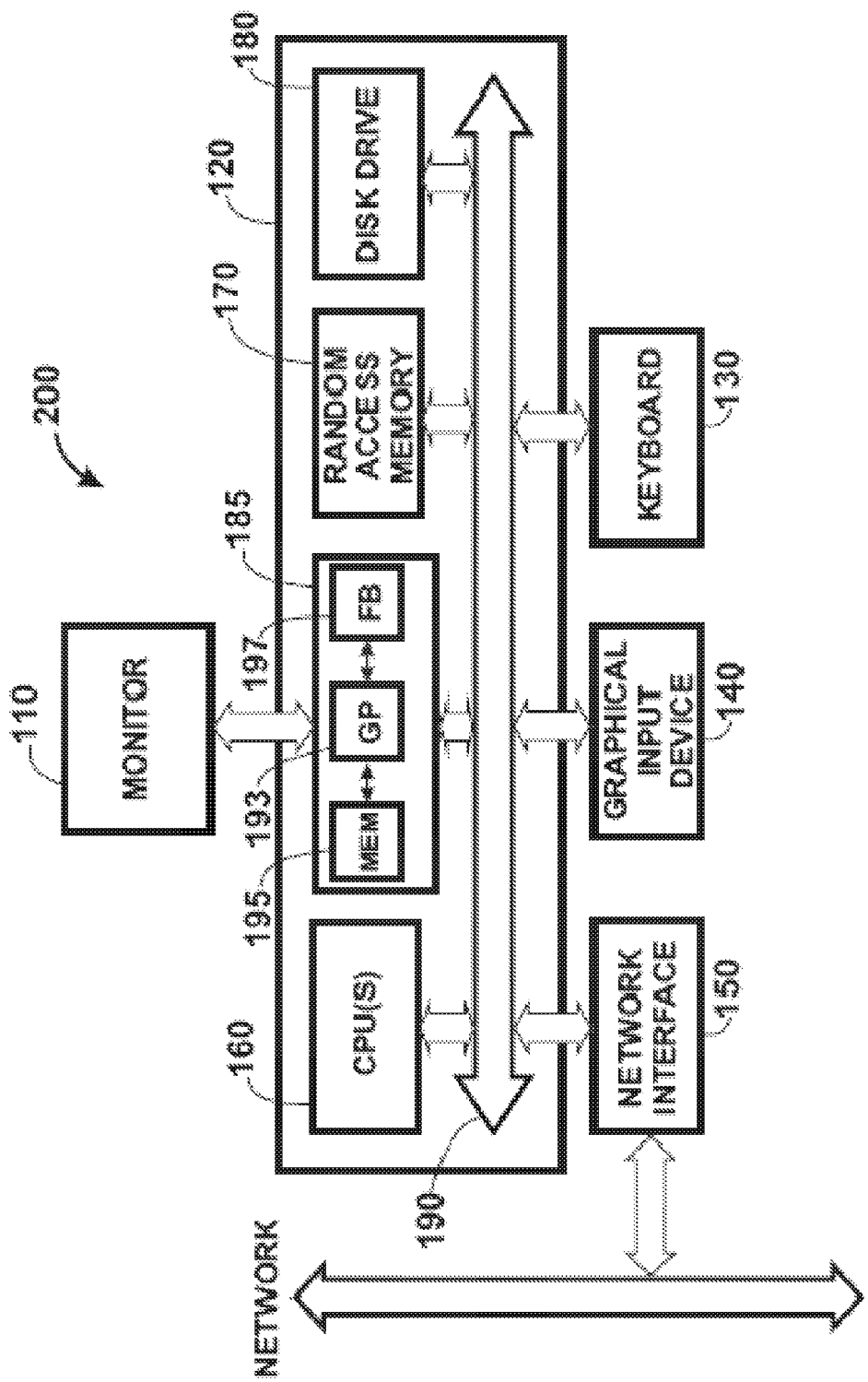
FIG. 2 is a simplified view diagram of a control system for the system for large scale manufacture of thin film photovoltaic devices of FIG. 1 according to an embodiment of the present invention.

FIG. 2 is a simplified view diagram of a control system 200 for the system for large scale manufacture of thin film photovoltaic devices of FIG. 1 according to an embodiment of the present invention. This diagram is merely an example, which should not unduly limit the scope of the claims herein. One of ordinary skill in the art would recognize other variations, modifications, and alternatives. As shown, control system 200 includes processors, memories, user interface devices, and interface to network. In an embodiment, the control system performs various control functions of, for example, system 100 or system 150.

In a specific embodiment, the control system 200 also controls various diagnostic tools disposed in-situ in systems 100 and 150 for critical process steps, such as formation of absorber layer and the window layer. Thin film properties are monitored in-situ. Electrical and optical properties are also measured in-situ in the process station. The electrical properties are measured either using probes or using a contactless method. The electrical properties are also used to detect shunts in the thin films. The data is used in feedback to adjust second process for absorber layer or window layer. Alternatively, the diagnostic and monitoring tools can also be used in a feed forward process for adjusting the next process for a second cell or within the cell design. In an embodiment, a process can be stopped based on in-situ measurement data. In another embodiment, process parameters are adjusted before the process is resumed.

Figure 3:
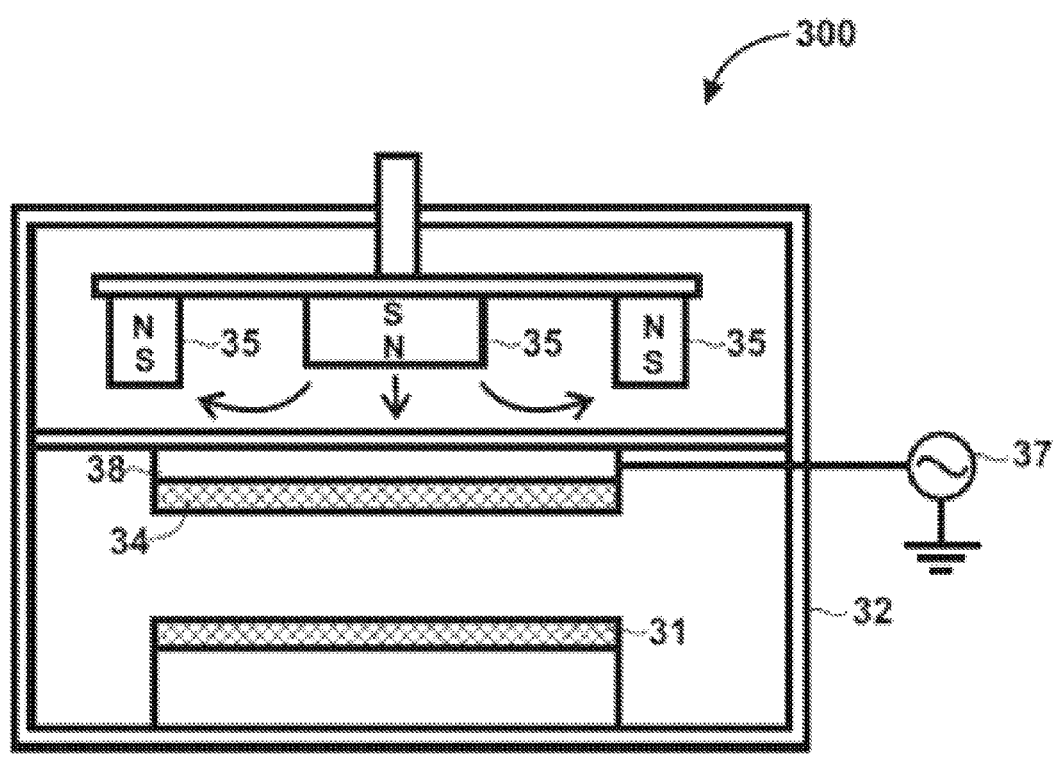
FIG. 3 is a simplified view diagram of a single physical vapor deposition tool which can be part of a system for large scale manufacture of thin film photovoltaic devices according to another embodiment of the present invention.

FIG. 3 is a simplified view diagram of a single physical vapor deposition (PVD) tool which can be part of a system for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. A PVD process is often carried out by sputtering in which collision of high-energy particles with sputtering targets to deposit materials ejected from the sputtering targets on a substrate. In a sputtering process thin films can be formed to a uniform thickness over a large area, and the composition ratio of thin films can be easily adjusted. In magnetron sputtering a magnetic field is used to help create a high-density plasma of energetic particles in a reaction chamber, usually under a low pressure.

As shown in FIG. 3, a substrate 31 is disposed in a vacuum chamber 32. A target 34 is disposed on the opposite side from the substrate 32. Magnets 35 are disposed behind the target 34 to form magnetic field lines of predetermined directions. In addition, a power supply unit 37 supplies a voltage to an electrode 38 which is coupled to target 34. During processing, a vacuum is maintained in the chamber, a gas such as argon is introduced in the chamber, and electric discharge creates plasma. Energetic particles collide with the target and cause atoms to be ejected from the target and deposited on the substrate to form a thin film.

One or more process stations in system 100 in FIG. 1A or system 150 in FIG. 1B may include a balanced magnetron sputtering station. In a specific embodiment, the magnet field are arranged to focus the plasma for large areas of substrate and to provide a uniform thin film over a large area. Depending on the embodiment, the size of the substrate can be 2' by 5' or larger. In an embodiment, when the sputtering targets can be about five foot wide or even wider, scanning magnetrons is used to keep uniformity of films. In an embodiment, the sputtering stations allow formation of thin films over large areas substantially free of pin-holes.

According to embodiments of the present invention, various methods are provided for large scale manufacture of photovoltaic devices. Examples of these methods are discussed below in connection with the drawings provided in FIGS. 4-12. It is noted that, in the examples discussed below, transferring the substrate in a controlled ambient can be carried out in different way. For example, the substrate can be transferred under reduced pressure, or the substrate can be transferred in an ambient of an inert gas, such as $N_2$ and Ar. Alternatively, the transfer can be carried out under atmospheric pressure in an inert gas. Additionally, physical deposition processes are used extensively in the examples discussed below. It is noted that in a specific embodiment, the physical deposition processes include sputtering using balanced magnetron.

In various embodiments discussed below, the substrate is a semiconductor, for example, silicon, germanium, compound semiconductor material such as a III-V gallium arsenide, germanium, silicon germanium, and others. Alternatively, the substrate can be a transparent substrate such as glass, quartz, fused silica, and others. Other examples of the substrate include a polymer material or a metal material. The metal chalcogenide material in the examples discussed below include copper (II) oxide (CuO) having a bandgap of about 1.2 eV and others. In a specific embodiment, the first bandgap is less than the second bandgap.

The conductor layers used in various embodiments can be aluminum, tungsten, or other metallic material. The conductor layer can also be a transparent conducting oxide material such as ZnO:Al, SnO:F, ITO, or others. The conductor layer can also be a conductive polymer material. Examples of various materials used in photovoltaic devices can be found in U.S. patent application Ser. No. 11/748,444, filed May 14, 2007, U.S. patent application Ser. No. 11/804,019, filed May 15, 2007, and concurrently filed U.S. Provisional Patent Application No. 60/988,099, filed Nov. 14, 2007. All these applications are commonly assigned, and their contents are hereby incorporated by reference for all purposes.

Figure 4:
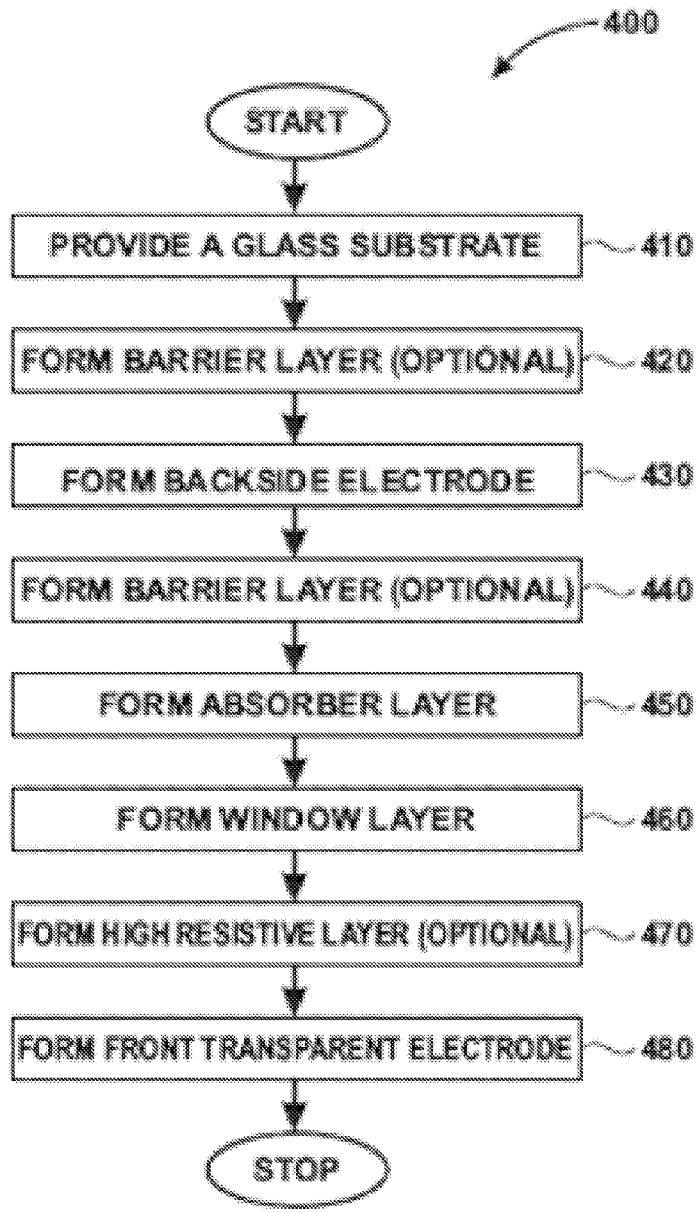
FIG. 4 is a simplified flow chart illustrating a method for large scale manufacture of thin film photovoltaic devices according to an embodiment of the present invention.

FIG. 4 is a simplified flow chart illustrating a method for large scale manufacture of single junction thin film photovoltaic devices according to an embodiment of the present invention. This diagram is merely an example, which should not unduly limit the scope of the claims herein. One of ordinary skill in the art would recognize other variations, modifications, and alternatives. As shown, the method of manufacturing a single junction photovoltaic device, also known as the substrate method, can be summarized as follows.

1. loading a substrate into a load lock station, the substrate including a surface region;
2. transferring the substrate under a controlled ambient to a first process station;
3. using a first physical deposition process in the first process station to cause formation of a first conductor layer overlying the surface region of the substrate;
4. transferring the substrate under reduced pressure to a second process station;
5. using a second physical deposition process in the second process station to cause formation of a first p-type absorber material, the first p-type absorber material comprising at least a first metal chalcogenide material overlying the first conductor layer, the first p-type absorber material being characterized by a first bandgap range and a first thickness range;
6. monitoring properties of the first p-type absorber material in the second process station;
7. transferring the substrate in a controlled ambient to a third process station;
8. using a third physical deposition process in the third process station to cause formation of a first n-type window layer, the first n-type window layer comprising at least a second metal chalcogenide material overlying the first p-type absorber layer; in a specific embodiment, the third physical deposition process being determined based on the properties of the first p-type absorber material;
9. transferring the substrate under a controlled ambient to a fourth process station; and
10. using a fourth physical deposition process in the fourth process station to cause formation of a second conductor layer overlying the second buffer layer.

In a specific embodiment, the method also includes forming a second barrier layer overlying the first conductor layer. In another embodiment, the method includes forming a first high resistivity layer overlying the first conductor layer before the formation of the first p-type absorber material, the first buffer layer being characterized by a resistivity greater than about 10 kohm-cm. The buffer layer is sometimes referred to as a high-resistance transparent conducting oxide buffer layers or HRT. The HRT can minimize effect of shunt defects. In a specific embodiment, the resistivity HRT is about 10 k ohm per centimeter, whereas the resistivity of the transparent conduction oxide layer (TCO) is about 7 to 10 ohms per centimeter. In another specific embodiment, the method further includes in-situ monitoring properties of the layer being formed in each process station and determining a process condition in a subsequent physical deposition process based on data obtained in the monitoring of the earlier processes.

Figure 5:
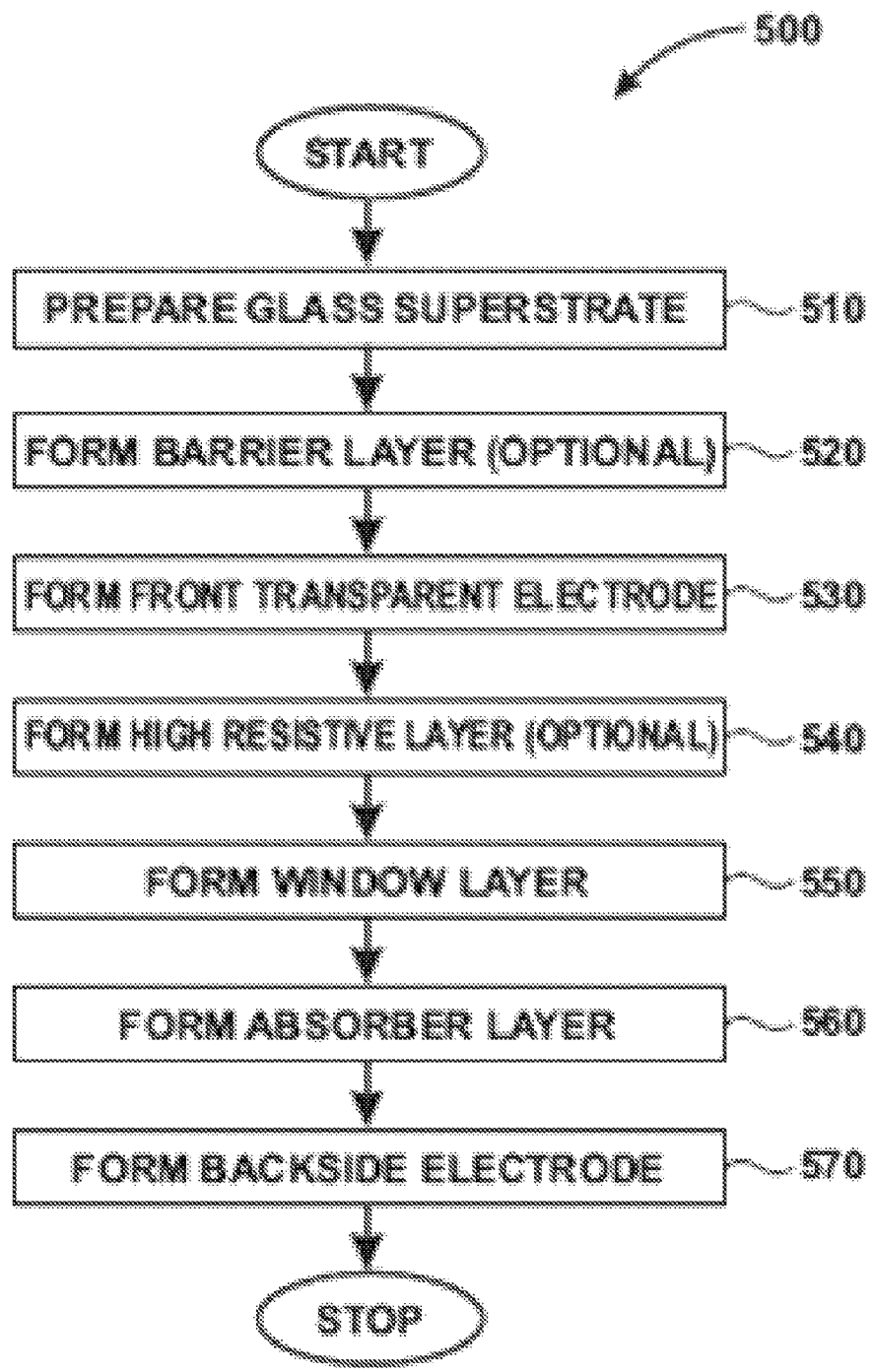
FIG. 5 is a simplified flow chart illustrating a method for large scale manufacture of thin film photovoltaic devices according to another embodiment of the present invention.

FIG. 5 is a simplified flow chart illustrating a method for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. As shown, another method of manufacturing a single junction photovoltaic device, also known as the superstrate method, can be briefly summarized below.

1. loading a substrate into a load lock station, the substrate including a surface region;
2. transferring the substrate under a controlled ambient to a first process station;
3. using a first physical deposition process in the first process station to cause formation of a first conductor layer overlying the surface region of the substrate;
4. transferring the substrate under reduced pressure to a second process station;
5. using a second physical deposition process in the second process station to cause formation of a first n-type window layer, the first n-type window layer comprising at least a second metal chalcogenide material overlying the first p-type absorber layer;
6. monitoring properties of the first p-type absorber material in the second process station;
7. transferring the substrate in a controlled ambient to a third process station;
8. using a third physical deposition process in the third process station to cause formation of a first p-type absorber material, the first p-type absorber material comprising at least a first metal chalcogenide material overlying the first conductor layer, the first p-type absorber material being characterized by a first bandgap range and a first thickness range; in a specific embodiment, the third physical deposition process is determined based on the properties of the first n-window layer;
9. transferring the substrate under a controlled ambient to a fourth process station; and
10. using a fourth physical deposition process in the fourth process station to cause formation of a second conductor layer overlying the second buffer layer.

In a specific embodiment, the method of FIG. 5 also includes a feed forward control. The method includes the additional processes of in-situ monitoring properties of the layer being formed in each process station, and determining a process condition in a subsequent physical deposition process based on data obtained in the monitoring of the earlier processes.

Figure 6:
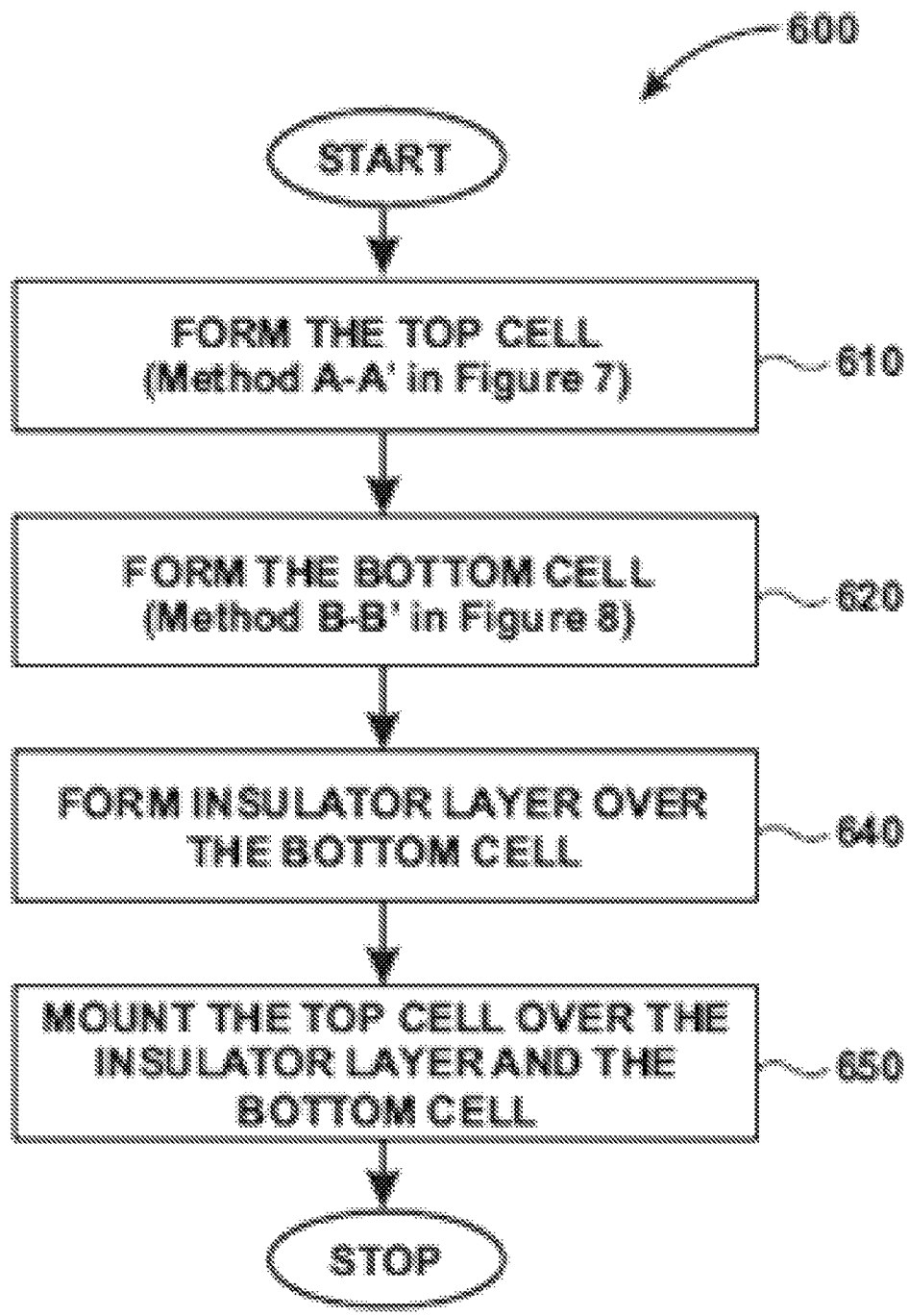
FIGS. 6-8 are simplified flow charts illustrating a method for large scale manufacture of thin film photovoltaic devices according to another embodiment of the present invention.
Figure 7:
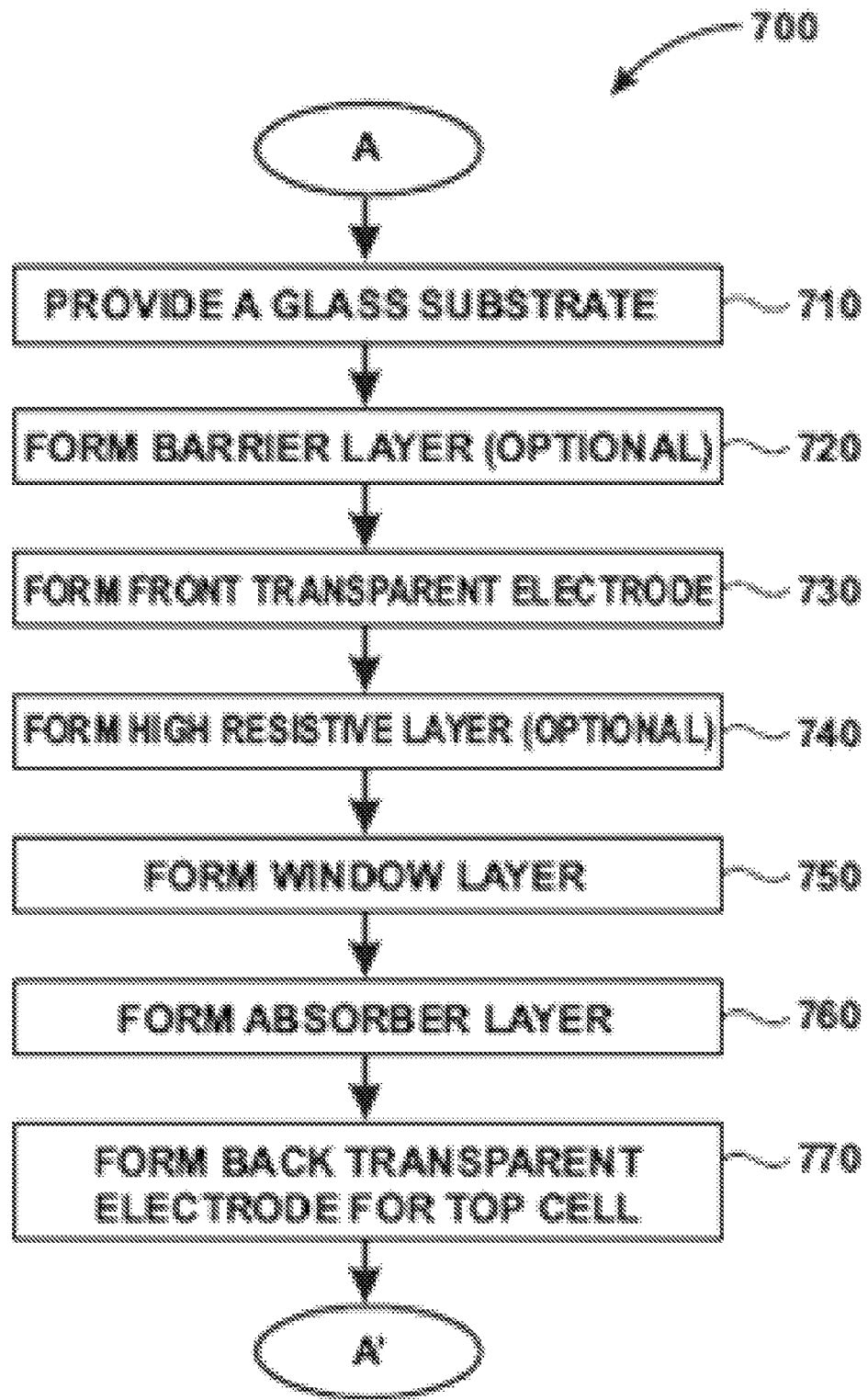
Figure 8:
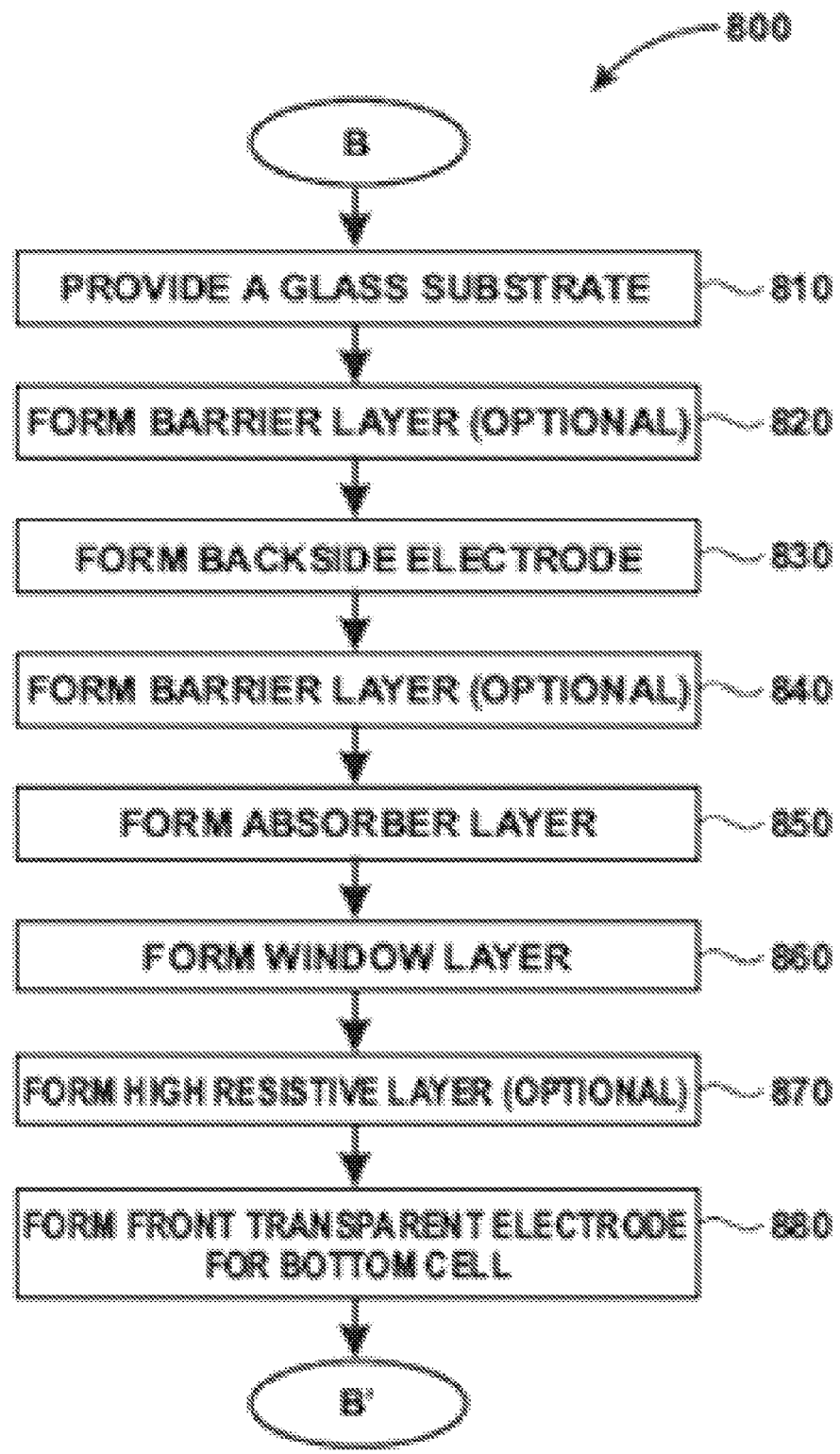

FIGS. 6-8 are simplified flow charts illustrating a method for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. As shown, the method is for making two photovoltaic devices stacked to make a tandem device, with each photovoltaic device having two terminals. The method can be briefly summarized as follows.

1. forming a top photovoltaic device using the superstate method of FIG. 5 as described above;
2. forming a bottom photovoltaic device using the substrate method of FIG. 4 as described above;
3. forming an insulator layer overlying the bottom photovoltaic device; and
4. mounting the top photovoltaic device over the insulator layer and the bottom photovoltaic device.

In a specific embodiment, the top device, the insulator layer, and the bottom layer are laminated together with an EVA material. Of course, other kinds of adhesive materials can also be used. In another specific embodiment, the method further includes a feed forward process which allows monitoring device properties of the top photovoltaic device and adjusting device parameters and process conditions for the bottom photovoltaic device.

Figure 9:
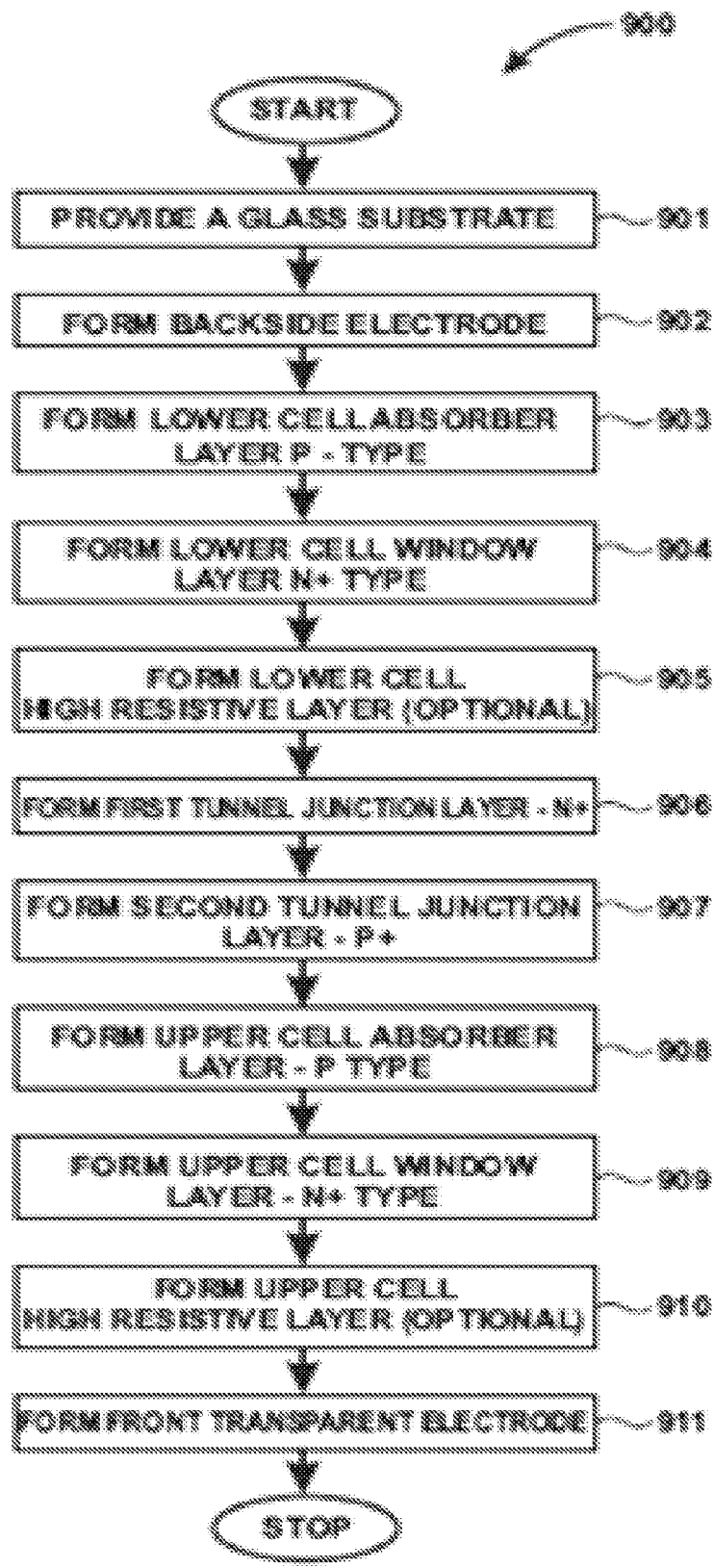
FIG. 9 is a simplified flow chart illustrating a method for large scale manufacture of thin film photovoltaic devices according to another embodiment of the present invention.

FIG. 9 is a simplified flow chart illustrating a method for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. As shown, the method is for manufacturing a tandem photovoltaic device, which includes two photovoltaic junctions but has only two external terminals. The method can be briefly summarized as follows.

1. loading a substrate into a load lock station, the substrate including a surface region;
2. transferring the substrate in a controlled ambient to a first process station;
3. using a first physical deposition process in the first process station to cause formation of a first conductor layer overlying the surface region of the substrate;
4. transferring the substrate in a controlled ambient to a second process station;
5. using a second physical deposition process in the second process station to cause formation of a first p-type absorber material, the first p-type absorber material comprising at least a first metal chalcogenide material overlying the first conductor layer, the first p-type absorber material being characterized by a first bandgap range and a first thickness range;
6. transferring the substrate in a controlled ambient to a third process station;
7. using a third physical deposition process in the third process station to cause formation of a first n-type window layer, the first n-type window layer comprising at least a second metal chalcogenide material overlying the first p-type absorber layer;
8. transferring the substrate in a controlled ambient to a fourth process station;
9. using a fourth physical deposition process in the fourth process station to cause formation of an n++ type semiconductor material;
10. transferring the substrate in a controlled ambient to a fifth process station;
11. using a fifth physical deposition process in the fifth process station to cause formation of an p++ type semiconductor material, the p++ semiconductor material and the n++ semiconductor material forming a tunneling junction layer;
12. transferring the substrate in a controlled ambient to a sixth process station;
13. using a sixth physical deposition process in the sixth process station to cause formation of a second p-type absorber material, the second p-type absorber material comprising at least a third metal chalcogenide material overlying the tunneling junction layer, the second p-type absorber material being characterized by a second bandgap range and a second thickness range;
14. transferring the substrate in a controlled ambient to a seventh process station;
15. using a seventh physical deposition process in the seventh process station to cause formation of a second n-type window layer, the second n-type window layer comprising at least a fourth metal chalcogenide material overlying the second absorber layer;
16. transferring the substrate in a controlled ambient to an eighth process station; and
17. using an eighth physical deposition process in the eighth process station to cause formation of a second conductor layer.

In a specific embodiment of the method of FIG. 9, the method also includes feed forward control, for example, in-situ monitoring properties of the layer being formed in each process station and determining a process condition in a subsequent physical deposition process based on data obtained in the monitoring of the earlier processes. In a specific embodiment, the method also includes forming a first buffer layer overlying the first conductor layer before the formation of the first p-type absorber material. The first buffer layer has a resistivity greater than about 10 kohm-cm. In another embodiment, a second 1 buffer layer is formed overlying the second n-type window layer before the formation of the second conductor layer. The second buffer layer is characterized by a resistivity greater than about 10 kohm-cm.

Figure 10:
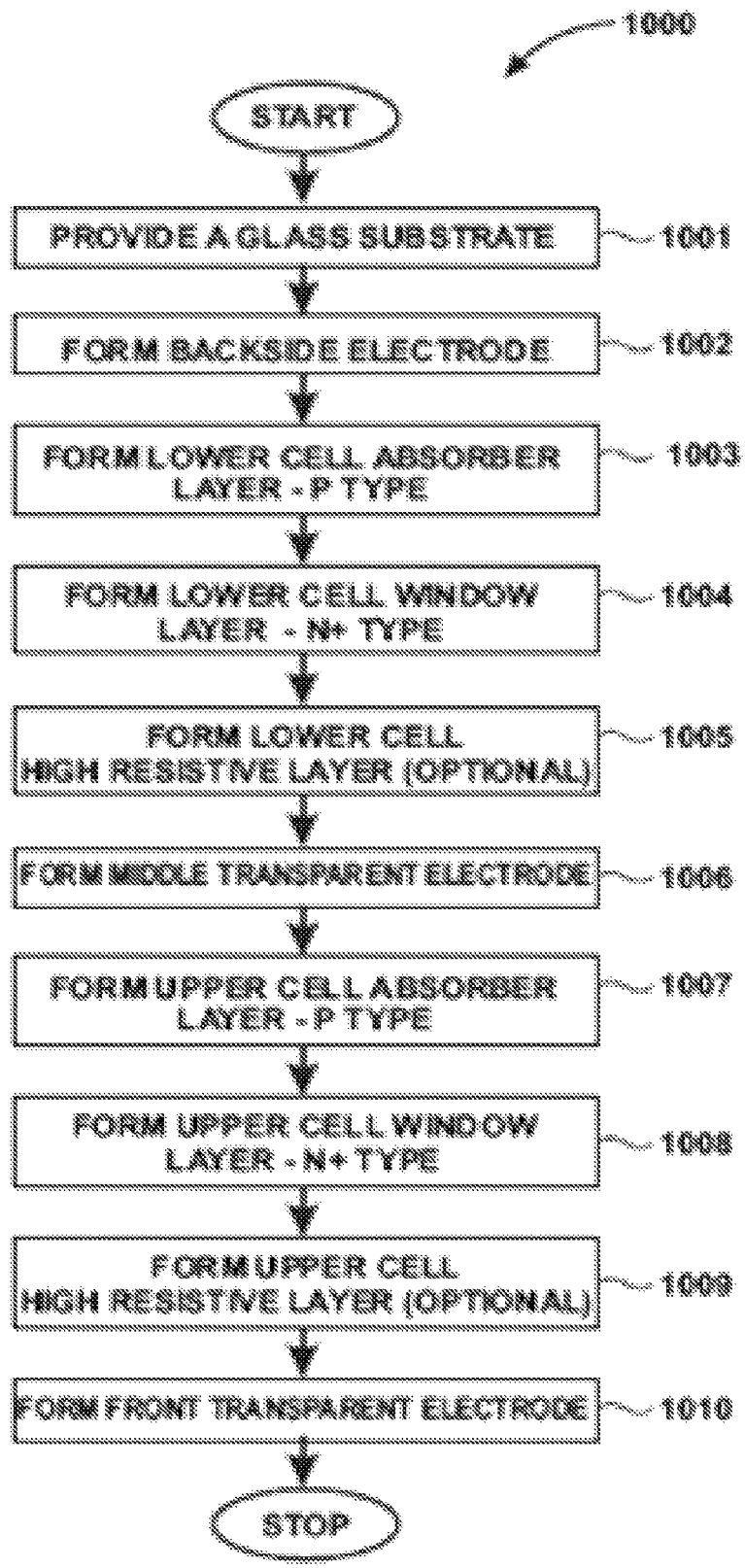
FIG. 10 is a simplified flow chart illustrating a method for large scale manufacture of thin film photovoltaic devices according to another embodiment of the present invention.

FIG. 10 is a simplified flow chart illustrating a method for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. As shown, FIG. 10 illustrates a method for manufacturing a tandem cell having three external terminals. In other words, the top and bottom photovoltaic devices share a common conductor which is coupled to an external terminal. The method can be briefly summarized below.

1. loading a substrate into a load lock station, the substrate including a surface region;
2. transferring the substrate in a controlled ambient to a first process station;
3. using a first physical deposition process in the first process station to cause formation of a first conductor layer overlying the surface region of the substrate;
4. transferring the substrate in a controlled ambient to a second process station;
5. using a second physical deposition process in the second process station to cause formation of a first p-type absorber material, the first p-type absorber material comprising at least a first metal chalcogenide material overlying the first conductor layer, the first p-type absorber material being characterized by a first bandgap range and a first thickness range;
6. transferring the substrate in a controlled ambient to a third process station;
7. using a third physical deposition process in the third process station to cause formation of a first n-type window layer, the first n-type window layer comprising at least a second metal chalcogenide material overlying the first p-type absorber layer;
8. transferring the substrate in a controlled ambient to a fourth process station;
9. optionally, using a fourth physical deposition process in the fourth process station to cause formation of a high resistive layer;
10. transferring the substrate in a controlled ambient to a fifth process station;
11. using a fifth physical deposition process in the fifth process station to cause formation of a second conductive layer;
12. transferring the substrate in a controlled ambient to a sixth process station;
13. using a sixth physical deposition process in the sixth process station to cause formation of a second p-type absorber material, the second p-type absorber material comprising at least a third metal chalcogenide material overlying the tunneling junction layer, the second p-type absorber material being characterized by a second bandgap range and a second thickness range;
14. transferring the substrate in a controlled ambient to a seventh process station;
15. using a seventh physical deposition process in the seventh process station to cause formation of a second n-type window layer, the second n-type window layer comprising at least a fourth metal chalcogenide material overlying the second absorber layer;
16. transferring the substrate in a controlled ambient to an eighth process station; and
17. using an eighth physical deposition process in the eighth process station to cause formation of a third conductor layer.

In a specific embodiment, the method of FIG. 10 also includes feed forward control. That is, the method also includes in-situ monitoring properties of the layer being formed in each process station and determining a process condition in a subsequent physical deposition process based on data obtained in the monitoring of the earlier processes.

Figure 11:
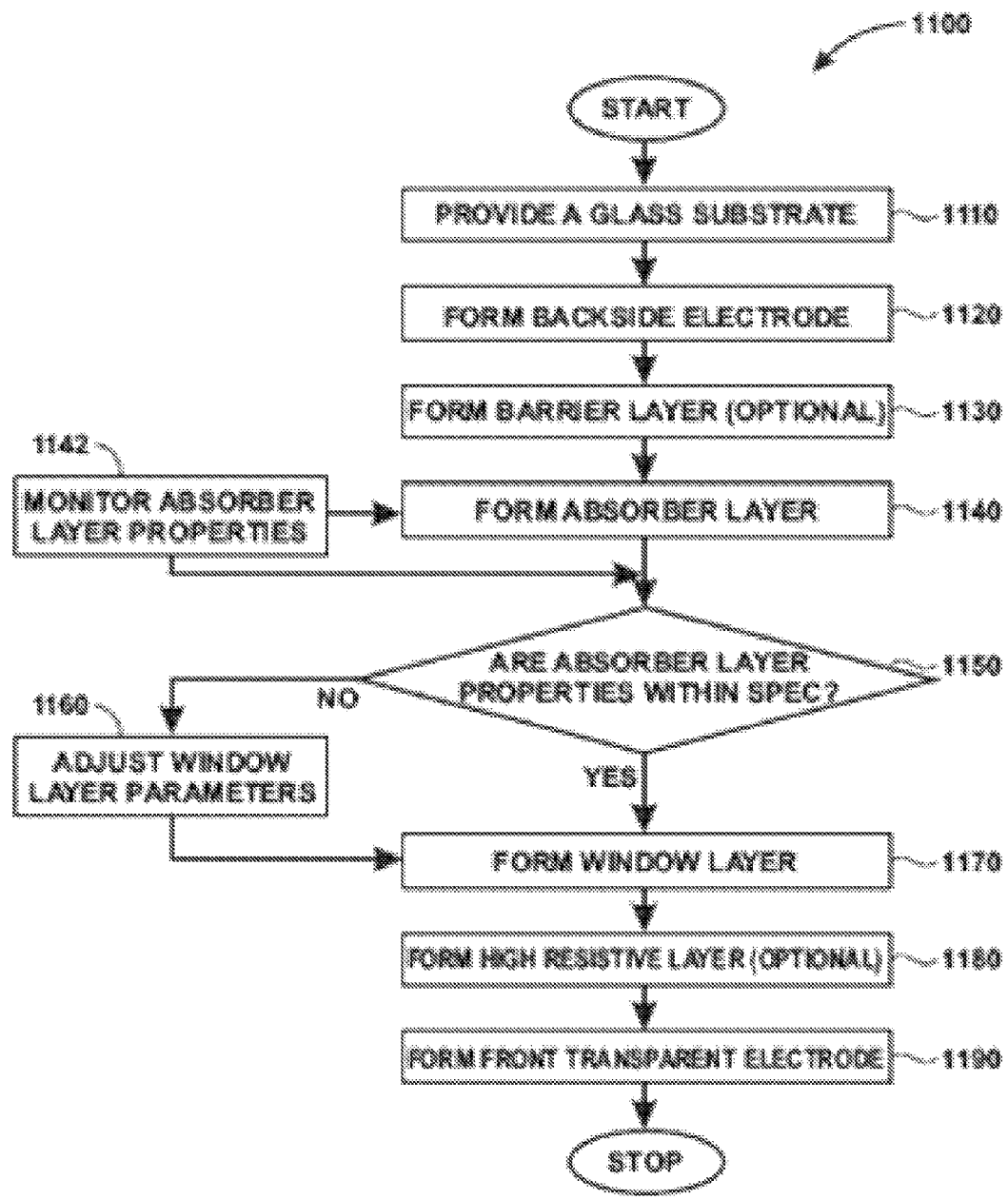
FIG. 11 is a simplified flow chart illustrating a method for large scale manufacture of thin film photovoltaic devices according to an embodiment of the present invention.

FIG. 11 is a simplified flow chart illustrating a method for large scale manufacture of thin film photovoltaic devices according to an embodiment of the present invention. This diagram is merely an example, which should not unduly limit the scope of the claims herein. One of ordinary skill in the art would recognize other variations, modifications, and alternatives. As shown, FIG. 11 illustrates a method for large scale manufacturing of single junction photovoltaic devices including feed forward control. The method can be summarized briefly as follows.

1. loading a substrate into a load lock station, the substrate including a surface region;
2. transferring the substrate under a controlled ambient to a first process station;
3. using a first physical deposition process in the first process station to cause formation of a first conductor layer overlying the surface region of the substrate;
4. transferring the substrate under a controlled ambient to a second process station;
5. using a second physical deposition process in the second process station to cause formation of a first p-type absorber material, the first p-type absorber material comprising at least a first metal chalcogenide material overlying the first conductor layer, the first p-type absorber material being characterized by a first bandgap range and a first thickness range;
6. monitoring properties of the first p-type absorber material in the second process station;
7. determining a process condition in a third physical deposition process based on data obtained in the monitoring;
8. transferring the substrate in a controlled ambient to a third process station;
9. using the third physical deposition process in the third process station to cause formation of a first n-type window layer, the first n-type window layer comprising at least a second metal chalcogenide material overlying the first p-type absorber layer,
10. transferring the substrate under a controlled ambient to a fourth process station; and
11. using a fourth physical deposition process in the fourth process station to cause formation of a second conductor layer overlying the second buffer layer.

Figure 12:
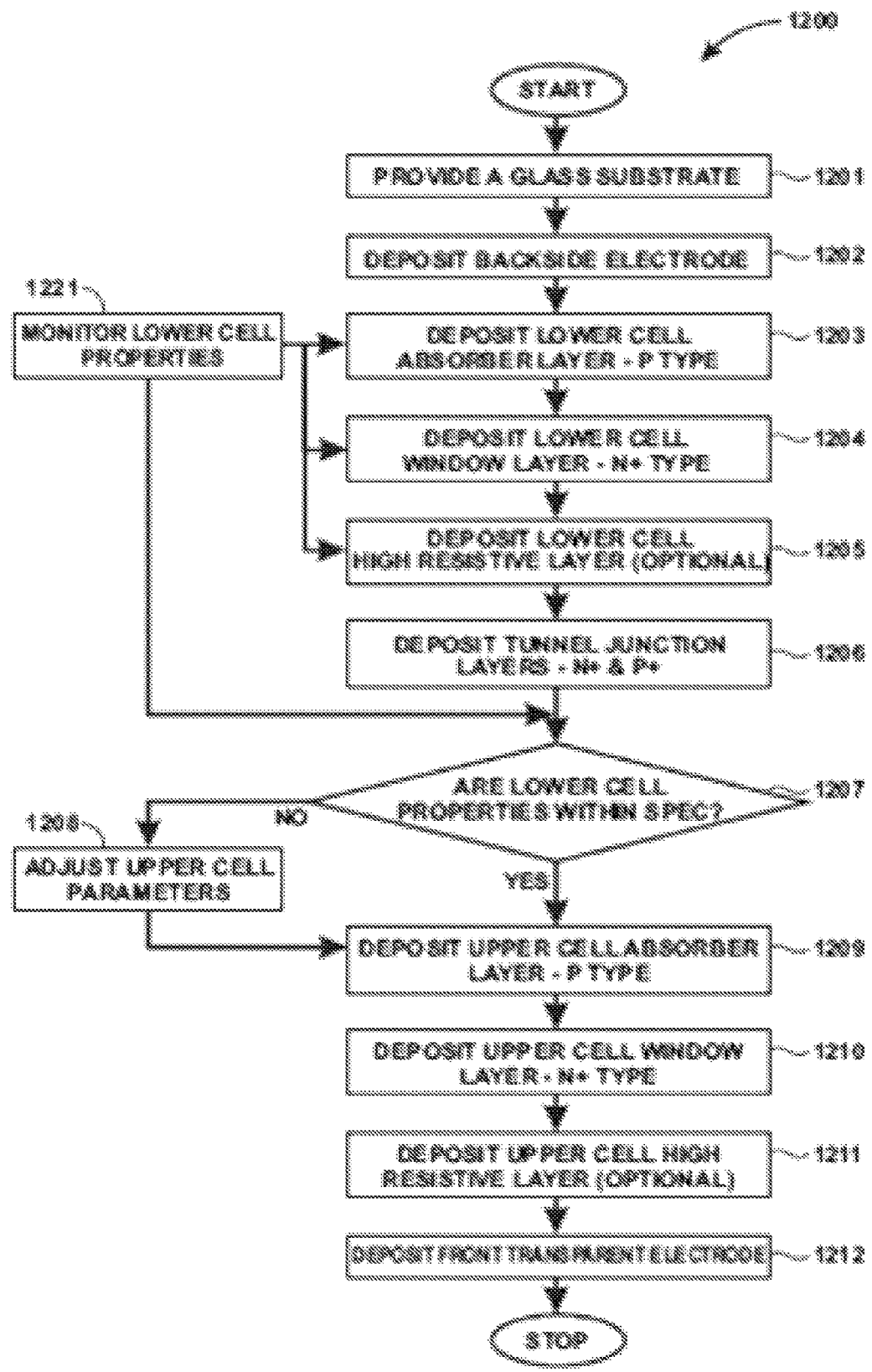
FIG. 12 is a simplified flow chart illustrating a method for large scale manufacture of thin film photovoltaic devices according to another embodiment of the present invention.

FIG. 12 is a simplified flow chart illustrating a method for large scale manufacture of thin film photovoltaic devices according to another embodiment of the present invention. This diagram is merely an example, which should not unduly limit the scope of the claims herein. One of ordinary skill in the art would recognize other variations, modifications, and alternatives. As shown, FIG. 12 illustrates a method for making a tandem photovoltaic device having a bottom photovoltaic cell and a top photovoltaic cell using methods similar to those of FIGS. 4-11, but also includes in-situ monitoring of the properties of the lower cell. These properties include thin film material properties and electrical and optical properties of the junction. If the properties are not within a predetermined specification, then the process and device parameters of the upper cell are adjusted. Subsequently the adjusted process is used to make the upper cell.

According to another specific embodiment of the present invention, a method is provided for making a single junction photovoltaic device including feed forward control. The method can be briefly summarized below.

1. loading a substrate into a load lock station, the substrate including a surface region;
2. transferring the substrate under a controlled ambient to a first process station;
3. using a first physical deposition process in the first process station to cause formation of a first conductor layer overlying the surface region of the substrate;
4. transferring the substrate under a controlled ambient to a second process station;
5. using a second physical deposition process in the second process station to cause formation of a first p-type absorber material, the first p-type absorber material comprising at least a first metal chalcogenide material overlying the first conductor layer, the first p-type absorber material being characterized by a first bandgap range and a first thickness range;
6. monitoring properties of the first p-type absorber material in the second process station;
7. determining a process condition in a third physical deposition process based on data obtained in the monitoring;
8. transferring the substrate in a controlled ambient to a third process station;

9. using the third physical deposition process in the third process station to cause formation of a first n-type window layer, the first n-type window layer comprising at least a second metal chalcogenide material overlying the first p-type absorber layer;
10. transferring the substrate under a controlled ambient to a fourth process station; and
11. using a fourth physical deposition process in the fourth process station to cause formation of a second conductor layer overlying the second buffer layer.

Figure 13:
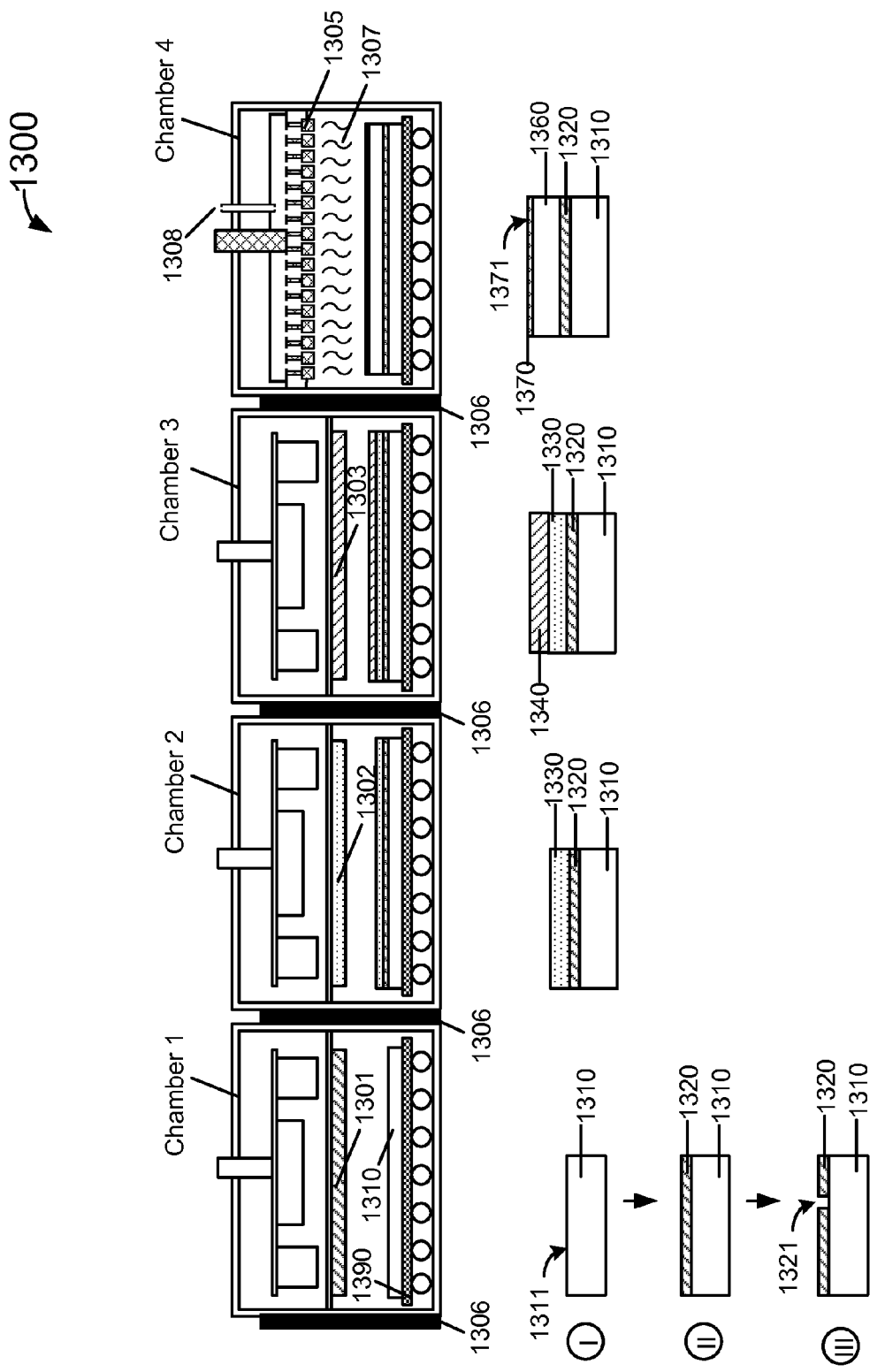
FIG. 13 is a simplified schematic diagram showing a system with multi-chamber configuration for large scale manufacture of thin film photovoltaic modules according to an embodiment of the present invention.

FIG. 13 is a simplified schematic diagram showing a system with multi-chamber configuration for large scale manufacture of thin film photovoltaic module according to an embodiment of the present invention. This diagram is merely an example, which should not unduly limit the scope of the claims herein. One of ordinary skill in the art would recognize other variations, modifications, and alternatives. As shown, a system 1300 (at least partially) with multi-chamber configuration for large scale manufacture of thin film photovoltaic modules is provided and several thin film processes are illustrated. In particular, a large substrate 1310 is provided as shown as a first step I into a Chamber 1 of the system 1300 with multi-chamber configuration. In an embodiment, a transfer tool 1390 including a process stage is used to support the large substrate 1310. Additionally, one or more loading locks or intermediate chambers 1306 can be used to assist the execution of in/out substrate transfer process. FIG. 13 merely shows a schematic example of the transfer tool 1390 and merely shows a location of the load lock chamber 1306 without providing structure details and even not shown in true dimensions. In an embodiment, the substrate 1310 is an optically transparent solid material. For example, the substrate 1310 can be a glass (e.g., the popular soda lime window glass), quartz, fused silica, or a plastic, or other optically transparent composite materials. In an example, the large substrate 1310 can be as large as 1.5 meters or greater in lateral dimension that is used for direct manufacture thin film photovoltaic module thereon. Depending upon embodiments, the substrate 1310 can be a single material, multiple materials, which are layered, composites, or stacked, including combinations of these, and the like. Of course there can be other variations, modifications, and alternatives.

As shown in FIG. 13 the substrate 1310 includes a surface region 1311 and is held in the process stage exposing to a deposition source disposed in Chamber 1. For example, the deposition source can be a sputtering target 1301 held a short distance above the surface region 1311. In an embodiment, the Chamber 1 is used for forming an electrode layer of a thin film photovoltaic module. In particular, an electrode layer 1320 can be sputtering deposited overlying the surface region 1311 of the substrate 1310. For example, the sputtering target 1301 made of substantially conductive material is predisposed. The conductive material for the electrode layer includes molybdenum, tungsten, aluminum, copper, silver, and the other metals. In an implementation, three sputtering targets made of 99.9999% pure molybdenum (Mo) material are used. The first target is used for forming a first Mo sublayer of the electrode layer 1320 and the other two target sequentially disposed in Chamber 1 are used for forming a second Mo sublayer of the electrode layer 1320.

The Chamber 1 can be maintained in a vacuum condition measured with a pressure of about 10 microbar. One or more working gases for assisting the sputtering process can be flowed in with rate control. For example, during the formation of the first Mo sublayer one working gas is pure Argon gas with a flow rate of about 100 sccm and another is Argon gas mixed with about 1% Oxygen gas with a flow rate of about 5-10 sccm. The first Mo sublayer can be 50 to 400 Angstroms according to embodiments of the invention. Subsequently, the second Mo sublayer can be formed overlying the first Mo sublayer. In an embodiment, two sputtering targets made of molybdenum material are disposed in series to form the second Mo sublayer with a total thickness of 3000 to 3500 Angstroms. Using two targets may allow the sputtering process to occur at a relative lower power density. In another embodiment, a single molybdenum target is also capable of forming the total thickness of the second Mo sublayer. During the formation of the second Mo sublayer, a pure Argon gas with a flow rate of about 100 sccm is introduced into the Chamber 1.

Of course, other thin film deposition techniques may be used including evaporation (e.g., using electron beam), chemical vapor deposition, electro-plating, atomic layer deposition, or any combination of these, and the like according to a specific embodiment. The electrode layer with a total thickness of about 300 to 400 nm can be characterized by resistivity of about 100 ohm-cm to 10 ohm-cm and less according to a specific embodiment. As shown in FIG. 13, the formation of the electrode layer 1320 refers a completion of a second step II performed in the Chamber 1.

Referring to FIG. 13, after the process finishes in the Chamber 1, the substrate 1310 with overlying electrode layer 1320 can be transferred out of the Chamber 1 by the transfer tool 1390 via a load lock 1306. In an embodiment, the process of manufacture thin film photovoltaic module includes patterning the electrode layer. The electrode layer 1320 needs to be reconfigured and patterned to form a plurality of electrodes that can be used to draw photo-electric currents when the thin film photovoltaic module finally is set to use under the sun. In particular, the patterning process can use a mechanical patterning technique, a laser patterning technique, a chemical patterning technique, etc. In an implementation, the patterning process is performed in atmosphere environment outside the Chamber 1. The transfer tool 1390 is configured to move the substrate from the Chamber 1 through one of loading lock 1306 to a specific work station for performing the patterning process.

The lower left part of FIG. 13 schematically shows that a patterning process is performed, as a step III, to the electrode layer 1320 to form one or more electrode pattern 1321. In an embodiment, laser ablation is used for forming the electrode pattern 1321. The electrode layer 1320 is subjected to a laser radiation at certain predetermined locations. The laser radiation can be a laser beam from a pulsed laser source or CW laser source. The laser beam can be aligned from above the electrode layer 1320 or from a backside of the transparent substrate 1310. For example the laser beam is generated from a Nd:YAG infrared Q-Switched pulse laser source with wavelength of about 1065 nm. As the laser beam irradiates the electrode layer 1320, an ablation process occurs during which a portion of the electrode layer 1320 under the laser beam can be removed from the substrate 1310. In particular, the laser energy causes vaporization of electrode layer material, e.g., molybdenum, under a beam spot or simply blows away from the substrate 1310. The laser beam can be scanned along a predetermined pattern and subsequently additional amount of certain conducting material is removed. Each time after the laser beam ablates a spot of electrode layer material, the beam is moved (may be pulsed OFF) to a next spot, then the laser power is pulsed ON to irradiate the new spot again to cause the electrode layer material under the new spot to be removed. As a result, one or more electrode patterns 1321 form in the electrode layer 1320.

Next, the substrate with patterned electrode layer can be further transferred into the system with multi-chamber configuration. In particular as shown in FIG. 13, the substrate 1310 is provided into a Chamber 2 of the system 1300. The Chamber 2 is a process chamber designed to couple with a load lock 1306 which may also coupled to the Chamber 1. In certain implementation, the patterning process can be directly performed within the Chamber 1 so that the transfer tool 1390 can further load the substrate 1310 directly from the Chamber 1 via the load lock 1306 into the Chamber 2 for continuing the large scale manufacture of the thin film photovoltaic module. Of course, there can be many alternatives, variations, and modifications.

In an embodiment, Chamber 2 is configured to form a copper layer overlying the electrode layer formed in last process. In particular, a copper (Cu)-bearing layer 1330 can be formed overlying the electrode layer 1320 using another sputtering process. In an example, the substrate 1310 with overlying electrode layer 1320 is exposed to a Cu-bearing sputtering target 1302 in Chamber 2. Please note, the electrode layer 1320 on the substrate 1310 likely is a layer with one or more electrode patterns 1321 formed in a previous step, even though no specific pattern is explicitly shown in the schematic illustrating of the process within the Chamber 2. In another example, a DC magnetron sputtering technique can be used to deposit the Cu-bearing layer 1330 onto the electrode layer 1320 under a following condition: The deposition is controlled to be about a vacuum environment having a pressure of 6.2 mTorr or lower with Ar gas. The gas flow rate is set to about 32 sccm. The deposition temperature can be just at room temperature without need of intentionally heating the substrate. Of course, minor heating may be resulted due to the plasma generated during the deposition. Additionally, the DC power supply of about 115 W may be required. According to certain embodiments, DC power in a range from 100 W to 150 W is suitable depending specific cases with different materials. The full deposition time for the Cu-bearing layer 1330 of about 330 nm thickness is about 6 minutes or more. Of course, the deposition condition can be varied and modified according to a specific embodiment. For example, a Cu-bearing target also includes a gallium (Ga) content or both Cu target and Ga target are disposed in series in the Chamber 2 so that the Cu-bearing layer 1330 comprises Cu—Ga alloy.

Referring to FIG. 13 again, after the formation of the Cu-bearing layer 1330, the system 1300 is configured to transfer the substrate 1310 with overlying electrode layer 1320 and Cu-bearing layer 1330 from the Chamber 2 to a next chamber, Chamber 3. In an embodiment, this chamber is designed to allow the transfer tool 1390 further load the substrate in and perform one or more processes of providing an indium (In) layer overlying the Cu-bearing layer for manufacture a thin film photovoltaic module. In particular as shown, the indium In layer 1340 is formed overlying the copper Cu-bearing layer 1330. In an implement, the indium layer can be deposited using a sputtering process and the Cu-bearing layer 1330 is exposed to an In-based sputtering target 1303 when the substrate 1310 with overlying electrode layer 1320 and Cu-bearing layer 1330 is loaded into the Chamber 3. In an example, the indium sputtering target contains 99.999% pure indium material and a DC magnetron sputtering technique can be used to deposit the In layer 1340 overlying the Cu layer 120 under a similar condition for depositing the Cu-bearing layer 1330. The deposition time for the indium layer 1340 may be shorter than that for Cu-bearing layer 1330. For example, 2 minutes and 45 seconds may be enough for depositing an In layer of about 410 nm in thickness according to a specific embodiment. In another example, the indium layer 1340 is provided overlying the Cu-bearing layer 1330 by an electroplating process, or other techniques dependent on specific embodiment.

According to embodiments of the present invention, FIG. 13 illustrates a method and system with multi-chamber configuration of forming a multilayered structure comprising at least copper and indium material on a transparent substrate for manufacture of a thin film photovoltaic module. In an embodiment, the Cu-bearing layer 1330 as well as the indium layer 1340 are provided with a controlled stoichiometric composition so that the multilayered structure is a Cu-rich composite material with an atomic ratio of Cu:In greater than 1 therein. For example, the atomic ratio of Cu:In within the multilayered structure can be in a range from 1.2:1 to 2.0:1 or larger depending upon the specific embodiment. In an implementation, the atomic ratio of Cu:In is between 1.35:1 and 1.60:1. In another implementation, the atomic ratio of Cu:In is selected to be about 1.55:1. In a specific embodiment, the formation process of indium layer 1340 substantially causes no change in atomic stoichiometry in the copper layer 1330 formed earlier. Alternatively, the formation process of the indium layer 1340 can be performed earlier within the Chamber 2 overlying the electrode layer 1320 while the formation process of the Cu-bearing layer 1330 is then performed later within the Chamber 3 overlying the indium layer 1340.

Referring to FIG. 13 further, the system 1300 is configured to use the multi-chamber configuration for forming a thin film photovoltaic module according to an embodiment of the present invention. As shown, after the formation of a multilayered structure comprising at least an indium layer 1340 over a Cu-bearing layer 1330, the substrate 1310 bearing the multilayered structure is further transferred from the Chamber 3 to a Chamber 4 by the transfer tool 1390 to subject a thermal treatment process. As an embodiment, the Chamber 4 is configured to supply thermal energy using a plurality of heaters 1305 and provide an environment 1307 containing a sulfur bearing species 1308. The plurality of heaters 1305 are capable of heat the Chamber 4 to a temperature of about 400 Degrees Celsius to about 600 Degrees Celsius for at least about three to fifteen minutes. In a specific embodiment, the plurality of heaters 1305 combined with the Chamber 4 are configured to be a rapid thermal processor. In one example, the sulfur bearing species 1308 are in a fluid phase. As an example, the sulfur can be provided in a solution, which has dissolved $Na_2S$, $CS_2$, $(NH_4)_2S$, thiosulfate, and others.

In a preferred embodiment, the sulfur bearing species 1308 are hydrogen sulfide in gas phase flowed through a valve into the Chamber 4. In other embodiments, the sulfur bearing species can be provided in a solid phase and heated or allowed to boil, which vaporizes into a gas phase sulfur. In particular, the gas phase sulfur is reacting to the indium/copper layers within the environment 1307 with a temperature about 500 Degrees Celsius. In other embodiments, other combinations of sulfur species can be used. Of course, the thermal treatment process includes certain predetermined ramp-up and ramp down period with certain predetermined speed for temperature changes. For example, the thermal treatment process is a rapid thermal annealing process. The hydrogen sulfide gas is provided through one or more nozzles with a suitable flow rate control. During the process Chamber 4 can be configured to control the hydrogen sulfide gas pressure using one or more pumps (not shown). Of course, there can be other variations, modifications, and alternatives.

In an alternative embodiment, the sulfur species can be provided as a layer overlying the indium and copper-bearing layers or copper and indium layers. In a specific embodiment, the sulfur material is provided as a thin layer or patterned layer. Depending upon the embodiment, the sulfur species can be provided as a slurry, powder, solid material, gas, paste, or other suitable form. Of course, there can be other variations, modifications, and alternatives. Accordingly, the Chamber 4 of the system 1300 can be reconfigured to adapt those alternative sulfur incorporation processes.

Referring back to the FIG. 13, the thermal treatment process performed in the Chamber 4 causes a reaction between copper indium composite material within the multilayered structure formed on the substrate 1310 and the gas phase sulfur bearing species 1308 introduced in the Chamber 4. As a result of the reaction, a layer of copper indium disulfide material 1360 (or a copper indium disulfide thin film) can be formed. In one example, the copper indium disulfide material 1360 is transformed from the copper indium composite material by incorporating sulfur ions/atoms stripped or decomposed from the sulfur bearing species 1308 into the indium layer 1340 overlying the Cu-bearing layer 1330 with indium atoms and copper atoms mutually diffusing therein. In an embodiment, the thermal treatment process would result in a formation of a cap layer 1370 over the transformed copper indium disulfide material 1360. The cap layer 1370 contains substantially copper sulfide material but substantially free of indium atoms. The cap layer 1370 is substantially thinner than the copper indium disulfide material 1360. Depending on the applications, the thickness of the copper sulfide material 1370 is on an order of about five to ten nanometers and greater associated with original Cu—In composite material made of an indium layer 1340 overlying the Cu-bearing layer 1330. The cap layer 1370 includes a surface region 1371 of the same copper sulfide material substantially free of indium atoms. In a specific embodiment, the formation of this cap layer 1370 is under a Cu-rich stoichiometry conditions within the original Cu—In composite material. Of course, there can be other variations, modifications, and alternatives.

Figure 14:
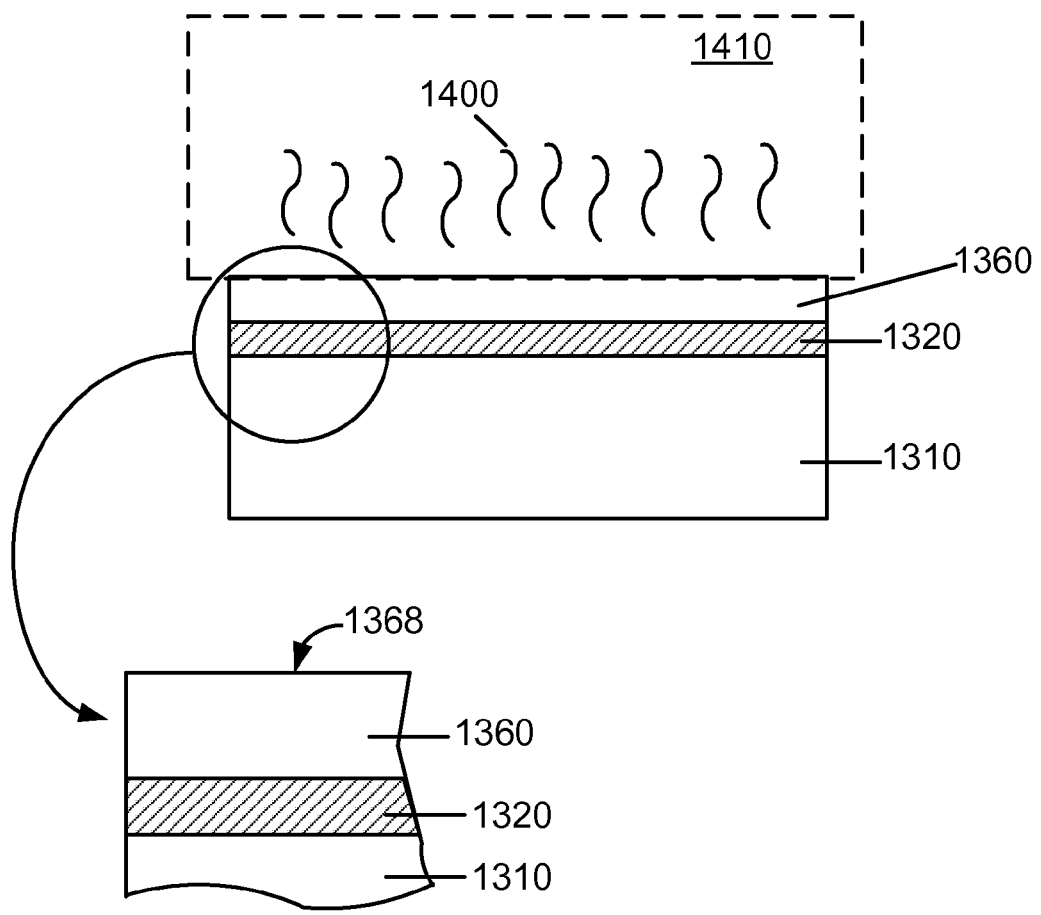
FIGS. 14-16 are simplified schematic diagrams showing additional processes of a method for large scale manufacture of thin film photovoltaic modules using multi-chamber configuration according to an embodiment of the present invention.
Figure 15:
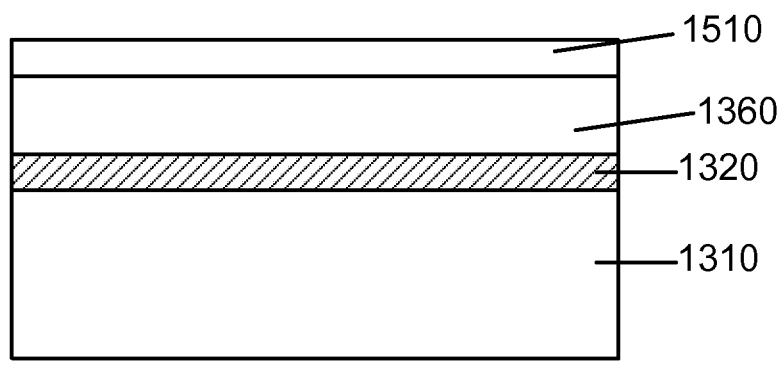
Figure 16:
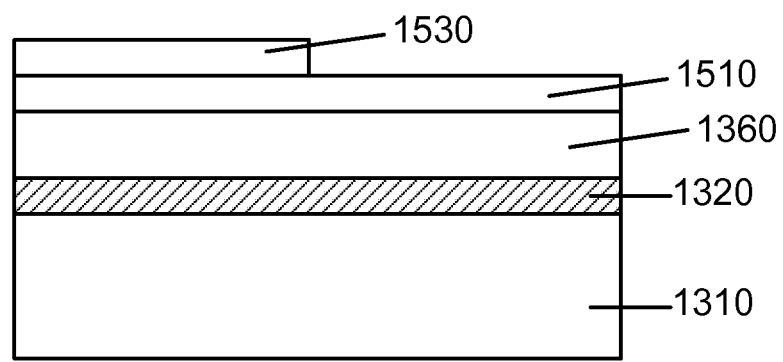

FIGS. 14-16 are simplified schematic diagrams illustrating additional processes using the system with multi-chamber configuration for manufacture of a thin film photovoltaic module according to an embodiment of the present invention. These diagrams are merely examples, which should not unduly limit the claims herein. One skilled in the art would recognize other variations, modifications, and alternatives. As shown in FIG. 14, a dip process 1400 is performed to the copper sulfide material 1370 that covers the copper indium disulfide thin film 1360. In particular, the dip process is an etching process performed by exposing the surface region 1371 of the copper sulfide material 1370 to 1 to about 10 wt % solution of potassium cyanide 1410 according to a specific embodiment. The potassium cyanide in solution 1410 acts as an etchant capable of selectively removing copper sulfide material 1370. The etching process starts from the exposed surface region 1371 down to the thickness of the copper sulfide material 1370 and substantially stops at the interface between the copper sulfide material 1370 and copper indium disulfide material 1360. As a result the copper sulfide cap layer 1370 can be selectively removed by the etching process so that a new surface region 1368 of the remaining copper indium disulfide thin film 1360 is exposed according to a specific embodiment. In a preferred embodiment, the etch selectivity is about 1:100 or more between copper sulfide material and copper indium disulfide thin film. In other embodiments, other selective etching species can be used. In a specific embodiment, the etching species can be hydrogen peroxide. In other embodiments, other techniques including electro-chemical etching, plasma etching, sputter-etching, or any combination of these can be used. In a specific embodiment, the copper sulfide material can be mechanically removed, chemically removed, electrically removed, or any combination of these, among others. In a specific embodiment, the absorber layer made of copper indium disulfide is about 1 to 10 microns, but can be others. Of course, there can be other variations, modifications, and alternatives.

The copper indium disulfide material 1360 formed at previous processes can have a p-type semiconductor characteristic through a proper impurity doping. For example, the copper indium disulfide material 1360 can be transformed to a photovoltaic absorber layer by doping sodium, boron, aluminum impurity materials. The grain of the film assisted by the doped impurity material can include substantially a crystallographic chalcogenide structure, which in general belongs to a chalcopyrite structure characterized by properties with excellent photoelectric conversion efficiency. In an embodiment, the copper indium disulfide material based photovoltaic absorber layer formed at previous processes can have a p-type semiconductor characteristic. In another embodiment, the copper indium disulfide material based photovoltaic absorber layer is subjected to additional doping process to have certain region with $p^{++}$ characteristic therein for the purpose of forming a high efficiency thin film photovoltaic modules. In an example, the copper indium disulfide material 1360 is mixed with a copper indium aluminum disulfide material. Of course, there can be other variations, modifications, and alternatives.

Subsequently as shown in FIG. 15, a window layer 1510 is formed overlying the p-type copper indium disulfide material 1360. The window layer 1510 can be selected from a group of materials consisting of a cadmium sulfide (CdS), a zinc sulfide (ZnS), zinc selenium (ZnSe), zinc oxide (ZnO), zinc magnesium oxide (ZnMgO), or others and may be doped with impurities for conductivity, e.g., $n^+$ type. The window layer 1510 is intended to serve another part of a PN junction associated with a photovoltaic cell. Therefore, the window layer 1510, during or after its formation, is heavily doped to form a $n^+$-type semiconductor layer. In one example, indium species are used as the doping material to cause formation of the $n^+$-type characteristic associated with the window layer 1510. In another example, the doping process is performed using suitable conditions. In a specific embodiment, ZnO window layer that is doped with aluminum can range from about 200 to 500 nanometers. Of course, there can be other variations, modifications, and alternative As shown in FIG. 16, a conductive layer 1530 is added at least partially on top of the window layer 1510 to form a top electrode layer for the photovoltaic module. In one embodiment, the conductive layer 1530 is a transparent conductive oxide TCO layer. For example, TCO can be selected from a group consisting of $In_2O_3$:Sn (ITO), ZnO:Al (AZO), $SnO_2$:F (TFO), and can be others. In another embodiment, the formation of the TCO layer is followed a certain predetermined pattern for effectively carried out the function of top electrode layer for the photovoltaic module with considerations of maximizing the efficiency of the thin film based photovoltaic modules. In a specific embodiment, the TCO can also act as a window layer, which essentially eliminates a separate window layer. Of course there can be other variations, modifications, and alternatives.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing thin film photovoltaic devices, the method comprising:
    accessing a substrate housed in a load lock station that has been depressurized from an external ambient pressure to a first internal pressure that is less than the external ambient pressure;
    transferring the substrate from the load lock station to a first process station, wherein the substrate is transferred to the first process station via a first transfer station, the first transfer station is mechanically coupled with the load lock station at a first end of the first transfer station, and the first transfer station is mechanically coupled with the first process station at a second end of the first transfer station;
    performing a first process for forming a thin film photovoltaic device in the first process station, wherein a first process temperature in the first process station is adjusted using a first process station temperature system, and a first process pressure in the first process station is adjusted using a first process station pressure system;
    returning the substrate from the first process station to the load lock station via the first transfer station;
    transferring the substrate from the load lock station to a second process station, wherein the substrate is transferred to the second process station via a second transfer station, the second transfer station is mechanically coupled with the load lock station at a first end of the second transfer station, and the second transfer station is mechanically coupled with the second process station at a second end of the second transfer station; and
    performing a second process for forming the thin film photovoltaic device in the second process station, wherein a second process temperature in the second process station is adjusted using a second process station temperature system, and a second process pressure in the second process station is adjusted using a second process station pressure system.

2. The method of claim 1, wherein the first transfer station includes a first transfer station pressure system that maintains a first transfer pressure during the transferring of the substrate to the first process station that is equal to the first process pressure.

3. The method of claim 1, wherein the first transfer station includes a first transfer station gas delivery system that delivers an inert gas to the first transfer station and maintains an inert environment in the first transfer station during the transferring of the substrate to the first process station.

4. The method of claim 1, wherein the first process for forming the thin film photovoltaic device comprises film deposition, patterning, etching, curing, annealing, or cleaning.

5. The method of claim 1, further comprising, prior to transferring the substrate from the load lock station to the second process station, adjusting the load lock pressure from the first internal pressure to a second internal pressure that is equal to the second process pressure, and wherein the second transfer station includes a second transfer station pressure system that maintains a second transfer pressure during the transferring of the substrate to the second process station that is equal to the second process pressure.

6. The method of claim 1, further comprising:
    transferring the substrate from the load lock station to a third process station, wherein the substrate is transferred to the third process station via a third transfer station, the third transfer station is mechanically coupled with the load lock station at a first end of the third transfer station, and the third transfer station is mechanically coupled with the third process station at a second end of the third transfer station;
    performing a third process for forming the thin film photovoltaic device in the third process station, wherein a third process temperature in the third process station is adjusted using a third process station temperature system, and a third process pressure in the third process station is adjusted using a third process station pressure system.

7. The method of claim 6, further comprising, prior to transferring the substrate from the load lock station to the third process station, adjusting a load lock pressure of the load lock station from the second process pressure to a third internal pressure that is equal to the third process pressure, and wherein the third transfer station includes a third transfer station pressure system that maintains a third transfer pressure during the transferring of the substrate to the third process station that is equal to the third process pressure.

8. The method of claim 7, wherein one of the first process station, the second process station, or the third process station is configured to form a copper-indium composite material with a Cu-rich stoichiometry overlying an electrode layer on the substrate.

* * * * *